(12) United States Patent
Takatsuka

(10) Patent No.: US 10,594,304 B2
(45) Date of Patent: Mar. 17, 2020

(54) ANALOG-DIGITAL CONVERSION DEVICE, SOLID STATE IMAGE PICKUP ELEMENT, AND IMAGE PICKUP DEVICE

(71) Applicant: SONY CORPORATION, Tokyo (JP)

(72) Inventor: Takafumi Takatsuka, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/307,203

(22) PCT Filed: Apr. 25, 2017

(86) PCT No.: PCT/JP2017/016370
§ 371 (c)(1),
(2) Date: Dec. 5, 2018

(87) PCT Pub. No.: WO2017/221544
PCT Pub. Date: Dec. 28, 2017

(65) Prior Publication Data
US 2019/0149138 A1    May 16, 2019

(30) Foreign Application Priority Data
Jun. 20, 2016   (JP) ................. 2016-121658

(51) Int. Cl.
*H03K 3/037*    (2006.01)
*H03M 1/56*     (2006.01)
(Continued)

(52) U.S. Cl.
CPC .............. *H03K 3/037* (2013.01); *H03M 1/12* (2013.01); *H03M 1/56* (2013.01); *H04N 5/3745* (2013.01); *H04N 5/378* (2013.01)

(58) Field of Classification Search
CPC ........... H03M 1/12; H03M 1/56; H03K 3/037
(Continued)

(56) References Cited

U.S. PATENT DOCUMENTS 5,463,419 A * 10/1995 Saito ..................... H04N 1/646
348/231.9
5,675,733 A * 10/1997 Williams ................ H04L 51/30
709/206
(Continued)

FOREIGN PATENT DOCUMENTS

| CN | 105519096 A | 4/2016 |
|---|---|---|
| JP | 4-267670 A | 9/1992 |

(Continued)

OTHER PUBLICATIONS

International Search Report and Written Opinion of PCT Application No. PCT/JP2017/016370, dated Jul. 18, 2017, 02 pages of translation and 07 pages of ISRWO.

(Continued)

*Primary Examiner* — Peguy Jean Pierre
(74) *Attorney, Agent, or Firm* — Chip Law Group

(57) ABSTRACT

A analog-digital conversion device is provided with a comparison unit, a holding unit, a bidirectional conveying unit, and a control unit. The comparison unit compares an input signal with a reference signal. The holding unit holds a digital signal corresponding to the reference signal in the timing in which a result of the comparison has changed. The bidirectional conveying unit inputs a digital signal into the holding unit to cause the holding unit to hold the digital signal, and reads the held digital signal as a result of analog-digital conversion for the input signal. The control unit controls internal resistance of the bidirectional conveying unit to be set at a value that differs between when the holding unit is caused to hold the digital signal, and when the held digital signal is read from the holding unit.

13 Claims, 28 Drawing Sheets

(51) Int. Cl.
*H03M 1/12* (2006.01)
*H04N 5/3745* (2011.01)
*H04N 5/378* (2011.01)

(58) Field of Classification Search
USPC ........................................................ 341/155
See application file for complete search history.

(56) References Cited

U.S. PATENT DOCUMENTS

2012/0326113 A1* 12/2012 Yoneda .............. G11C 13/0007
257/4
2013/0016260 A1 1/2013 Maruta et al.
2018/0152650 A1* 5/2018 Sakakibara ............ H04N 5/355

FOREIGN PATENT DOCUMENTS

| | | |
|---|---|---|
| JP | 04-267670 A | 9/1992 |
| JP | 2002-141506 A | 5/2002 |
| JP | 2013-26675 A | 2/2013 |
| JP | 2013-026675 A | 2/2013 |
| WO | 2016/009832 A1 | 1/2016 |

OTHER PUBLICATIONS

Yang, et al., "A Nyquist-Rate Pixel-Level ADC for CMOS Image Sensors", IEEE Journal of Solid-State Circuits, vol. 34, No. 3, Mar. 1999, 348-356 pages.

* cited by examiner

ANALOG-DIGITAL CONVERSION DEVICE, SOLID STATE IMAGE PICKUP ELEMENT, AND IMAGE PICKUP DEVICE

CROSS REFERENCE TO RELATED APPLICATIONS

This application is a U.S. National Phase of International Patent Application No. PCT/JP2017/016370 filed on Apr. 25, 2017, which claims priority benefit of Japanese Patent Application No. JP 2016-121658 filed in the Japan Patent Office on Jun. 20, 2016. Each of the above-referenced applications is hereby incorporated herein by reference in its entirety.

TECHNICAL FIELD

The present technology relates to an analog-digital conversion device, a solid state image pickup element, and an image pickup device. More specifically, the present technology relates to an analog-digital conversion device having a holding unit that holds a result of analog-digital conversion, a solid state image pickup element, and an image pickup device.

BACKGROUND ART

In the prior art, with respect to an image pickup element having pixels arranged thereon in a two-dimensional matrix, in order to fulfill a request to speed up the output of an image signal, the request being made in recent years, an image pickup element having pixels, each of which has an analog-digital conversion device arranged therein, is used. This image pickup device speeds up analog-digital conversion by concurrently performing the analog-digital conversion in all pixels. For example, there is proposed a system in which each pixel has an analog-digital conversion device arranged therein, the analog-digital conversion device including: a comparison unit that compares an analog image signal generated by a photodiode with a reference signal; and a latch that holds a digital signal generated on the basis of a result of the comparison.

Here, the reference signal is a signal, the voltage of which changes in a ramp-shaped manner, and is a signal that is commonly input into analog-digital conversion devices of all pixels arranged on an image pickup device. In the above-described system, the comparison unit compares the analog image signal with the reference signal. In addition, when a shift occurs from a low voltage state in which a voltage of the reference signal is lower than a voltage of the analog image signal to a high voltage state in which the voltage of the reference signal is higher than the voltage of the analog image signal, or when a shift occurs from the high voltage state to the low voltage state, a change in the voltage is detected, and is then output as a result of the comparison. Further, a code word that is a digital signal corresponding to the voltage of the reference signal is input into the latch, and the input code word is held in the latch on the basis of the detection result detected by the comparison unit. Subsequently, the code word held in the latch is output as a result of analog-digital conversion (for example, refer to Non-Patent Document 1).

CITATION LIST

Non-Patent Document

Non-Patent Document 1: D. Yang, B. Fowler, and A. El Gamal, "A Nyquist Rate Pixel Level ADC for CMOS Image Sensors," Proc. of IEEE 1998 Custom Integrated Circuits Conf., Santa Clara, Calif., pp. 237-240 (1998)

SUMMARY OF THE INVENTION

Problems to be Solved by the Invention

In the prior art described above, the latch that holds a value of code word bits is used for a capacitor connected to a node. An input signal line that conveys a code word to be held, and an output signal line that outputs a signal corresponding to the held code word, are individually wired to this latch, and the code word is input and output therethrough. Therefore, in the prior art described above, it is necessary to control inputting/outputting into/from the holding unit individually, and so there exists a problem that a configuration of the image pickup element becomes complicated. Accordingly, it is considered that the configuration of the image pickup element is simplified by using a latch having a common input terminal and a common output terminal. However, in this case, inputting/outputting into/from the latch are performed by a common signal line, and therefore there is a possibility that a malfunction will occur due to destruction of held data at the time of outputting from the latch The present technology has been devised in consideration of such a situation, and an object of the present technology is to perform, by simple control, inputting/outputting into/from a holding unit for holding a result of analog-digital conversion, while preventing a malfunction, thereby simplifying a configuration of a solid state image pickup element.

Solutions to Problems

The present technology has been achieved to solve the above-described problems, and a first aspect thereof is an analog-digital conversion device including: a comparison unit that compares an input signal with a reference signal; a holding unit that holds a digital signal corresponding to the reference signal in timing in which a result of the comparison has changed; a bidirectional conveying unit that inputs the digital signal into the holding unit to cause the holding unit to hold the digital signal, and reads the held digital signal as a result of analog-digital conversion for the input signal; and a control unit that controls internal resistance of the bidirectional conveying unit to be set at a value that differs between when the holding unit is caused to hold the digital signal, and when the held digital signal is read from the holding unit. This produces an effect of causing the internal resistance of the bidirectional conveying unit to differ between inputting into the holding unit and outputting from the holding unit.

In addition, in this first aspect, the bidirectional conveying unit may be configured by a switching element that is brought into a conducting state when an ON signal is input into a control terminal, and the control unit may generate the ON signal, and may input the ON signal into the control terminal. This produces an effect of configuring the bidirectional conveying unit by a switching element that is brought into a conducting state when an ON signal is input.

Moreover, in this first aspect, the control unit may generate the ON signal that differs between when the holding unit is caused to hold the digital signal, and when the held digital signal is read from the holding unit. This produces an effect of, in the bidirectional conveying unit, causing an ON signal, which differs between at the time of inputting and at the time of outputting, to be input into a switching element.

Further, in this first aspect, the control unit may generate an ON signal having a voltage that differs between when the holding unit is caused to hold the digital signal, and when the held digital signal is read from the holding unit. This produces an effect of, in the bidirectional conveying unit, causing an ON signal having a voltage that differs between at the time of inputting and at the time of outputting to be input into a switching element.

Furthermore, in this first aspect, the control unit may generate an ON signal, the transition time of the ON signal differing between when the holding unit is caused to hold the digital signal, and when the held digital signal is read from the holding unit. This produces an effect of, in the bidirectional conveying unit, causing an ON signal, the transition time of the ON signal differing between at the time of inputting and at the time of outputting, to be input into a switching element.

In addition, in this first aspect, the bidirectional conveying unit may be configured by the plurality of switching elements that are connected in parallel. This produces an effect of configuring the bidirectional conveying unit by the plurality of switching elements that are connected in parallel.

Moreover, in this first aspect, the bidirectional conveying unit may be configured by the plurality of switching elements that differ in internal resistance in a conducting state. This produces an effect of configuring the bidirectional conveying unit by the plurality of switching elements that differ in internal resistance in a conducting state.

Further, in this first aspect, the control unit may control the number of the switching elements into which a control signal is input to differ between when the holding unit is caused to hold the digital signal, and when the held digital signal is read from the holding unit. This produces an effect of, in the bidirectional conveying unit, causing the number of the switching elements that are brought into a conducting state to differ between at the time of inputting and at the time of outputting.

In addition, in this first aspect, the bidirectional conveying unit may be configured by an N-channel MOS transistor and a P-channel MOS transistor. This produces an effect of configuring the bidirectional conveying unit by an N-channel MOS transistor and a P-channel MOS transistor.

Moreover, in this first aspect, the analog-digital conversion device may further include a precharge unit that applies a predetermined voltage to a terminal for reading the digital signal of the bidirectional conveying unit, in which after the predetermined voltage is applied, the control unit controls the internal resistance of the bidirectional conveying unit to be set at a different value. This produces an effect of, in the bidirectional conveying unit, applying a voltage by the precharge unit before the internal resistance is controlled to be set at a different value.

Furthermore, in this first aspect, the holding unit may be configured by a latch, and an input terminal and an output terminal of the latch may be commonly connected to the bidirectional conveying unit; and the control unit may control the internal resistance of the bidirectional conveying unit to be set at a value that, when the held digital signal is read from the holding unit, causes an applied voltage to be higher than a difference between a voltage applied to the output terminal of the digital signal of the bidirectional conveying unit and an input threshold value of the latch. This produces an effect of, at the time of outputting from the latch that composes the holding unit, causing the voltage of the input terminal of the latch to be lower than the threshold value.

In addition, a second aspect of the present technology is a solid state image pickup element including: a comparison unit that compares, with a reference signal, an input signal that is a signal corresponding to emitted light; a holding unit that holds a digital signal corresponding to the reference signal in timing in which a result of the comparison has changed; a bidirectional conveying unit that inputs the digital signal into the holding unit to cause the holding unit to hold the digital signal, and reads the held digital signal as a result of analog-digital conversion for the input signal; and a control unit that controls internal resistance of the bidirectional conveying unit to be set at a value that differs between when the holding unit is caused to hold the digital signal, and when the held digital signal is read from the holding unit. This produces an effect of causing the internal resistance of the bidirectional conveying unit to differ between inputting into the holding unit and outputting from the holding unit.

Moreover, a third aspect of the present technology is an image pickup device including: a comparison unit that compares, with a reference signal, an input signal that is a signal corresponding to emitted light; a holding unit that holds a digital signal corresponding to the reference signal in timing in which a result of the comparison has changed; a bidirectional conveying unit that inputs the digital signal into the holding unit to cause the holding unit to hold the digital signal, and reads the held digital signal as a result of analog-digital conversion for the input signal; a control unit that controls internal resistance of the bidirectional conveying unit to be set at a value that differs between when the holding unit is caused to hold the digital signal, and when the held digital signal is read from the holding unit; and a processing circuit that processes the output digital signal. This produces an effect of causing the internal resistance of the bidirectional conveying unit to differ between inputting into the holding unit and outputting from the holding unit.

Effects of the Invention

According to the present technology, an excellent effect of performing, by simple control, inputting/outputting into/from a holding unit for holding a result of analog-digital conversion, while preventing a malfunction, and thereby simplifying a configuration of a solid state image pickup element, can be exhibited. It should be noted that the effects described herein are not necessarily limited, and may be any one of the effects described in the present disclosure.

MODE FOR CARRYING OUT THE INVENTION

Modes for carrying out the present technology (hereinafter referred to as embodiment) will be described below. The description will be made in the following order.

1. First embodiment (an example of a case where a driving signal of a switching element is changed)
2. Second embodiment (an example of a case where a plurality of switching elements that differ in internal resistance at the time of conduction are used)
3. Third embodiment (an example of a case where precharging is performed)
4. Modified example 1. First Embodiment

[Configuration of Image Pickup Device]

Figure 1:
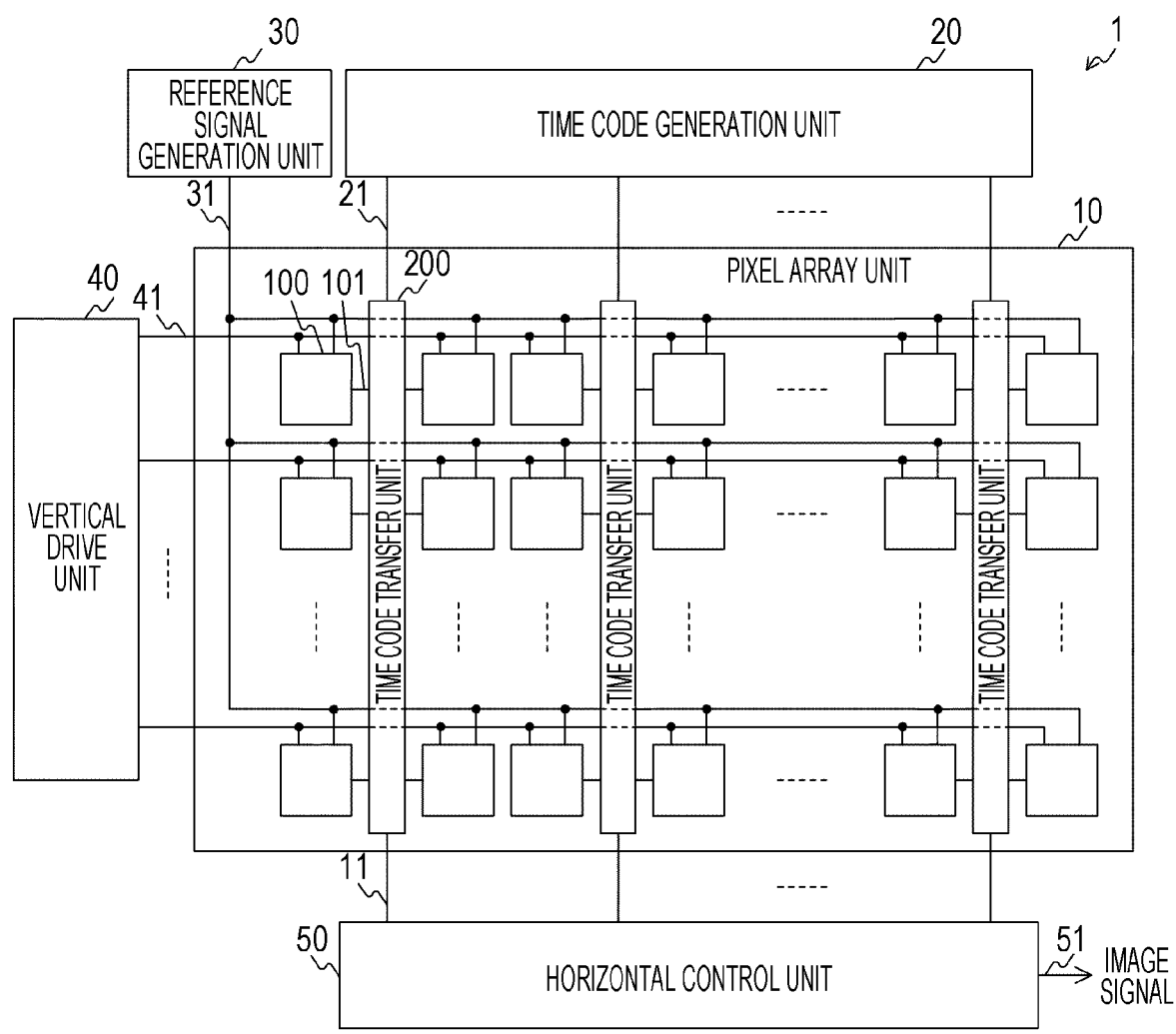
FIG. 1 is a diagram illustrating a configuration example of an image pickup device 1 according to an embodiment of the present technology.

FIG. 1 is a diagram illustrating a configuration example of an image pickup device 1 according to an embodiment of the present technology. This image pickup device 1 is provided with a pixel array unit 10, a time code generation unit 20, a reference signal generation unit 30, a vertical drive unit 40, and a horizontal control unit 50.

The pixel array unit 10 has a plurality of pixels 100 arranged thereon, and generates an image signal. This pixel array unit 10 includes: the pixels 100 that are arranged into a two-dimensional matrix form to generate an image signal; and a plurality of time code transfer units 200, each of which is arranged between pixel columns. The pixels 100 each perform photoelectric conversion to generate an analogue image signal, and then each subject this analog image signal to analog-digital conversion. Subsequently, the pixels 100 each output a time code described later as a result of the analog-digital conversion. The time code transfer units 200 each transfer this time code. Signal lines 101 are signal lines, each of which connects between the pixel 100 and the time code transfer unit 200. A configuration of the pixel 100 will be described later in detail. It should be noted that the pixel array unit 10 is an example of the solid state image pickup element set forth in claims.

The time code generation unit 20 generates time codes, and outputs the time codes to the time code transfer units 200. Here, the time code is a code that indicates the elapsed time from the start of analog-digital conversion in the pixel 100. This time code has a size that is equivalent to the number of bits of a digital image signal after the conversion. For example, a gray code can be used. The time codes are output to the time code transfer units 200 through the signal lines 21.

The reference signal generation unit 30 generates a reference signal, and outputs the reference signal to the pixels 100. This reference signal is a signal used as a reference of the analog-digital conversion in the pixel 100. For example, a signal, the voltage of which decreases in a ramp-shaped manner, can be used. This reference signal is output through a signal line 31. In addition, the generation and output of the time code by the time code generation unit 20 are executed in synchronization with the generation and output of the reference signal by the reference signal generation unit 30. As the result, the time code and the reference signal that are output from the time code generation unit 20 and the reference signal generation unit 30 respectively achieve one-to-one correspondence, which enables a voltage of the reference signal from the time code to be obtained. A time code decoding unit 52 described later performs decoding by obtaining the voltage of the reference signal from the time code.

The vertical drive unit 40 generates a control signal of the pixels 100, and power supply required for the operation of the pixels 100, and outputs the control signal and the power supply. This vertical drive unit 40 can be configured by a shift register and the like. In addition, the generated control signal and the like are output to the pixels 100 through signal lines 41. The signal lines 41, which are configured by a plurality of signal lines as described below, are arranged corresponding to respective rows of the pixels 100 arranged on the pixel array unit 10.

The horizontal control unit 50 processes the time code transferred by the time code transfer units 200. This time code is input into the horizontal control unit 50 through the signal lines 11.

[Configuration of Horizontal Control Unit]

Figure 2:
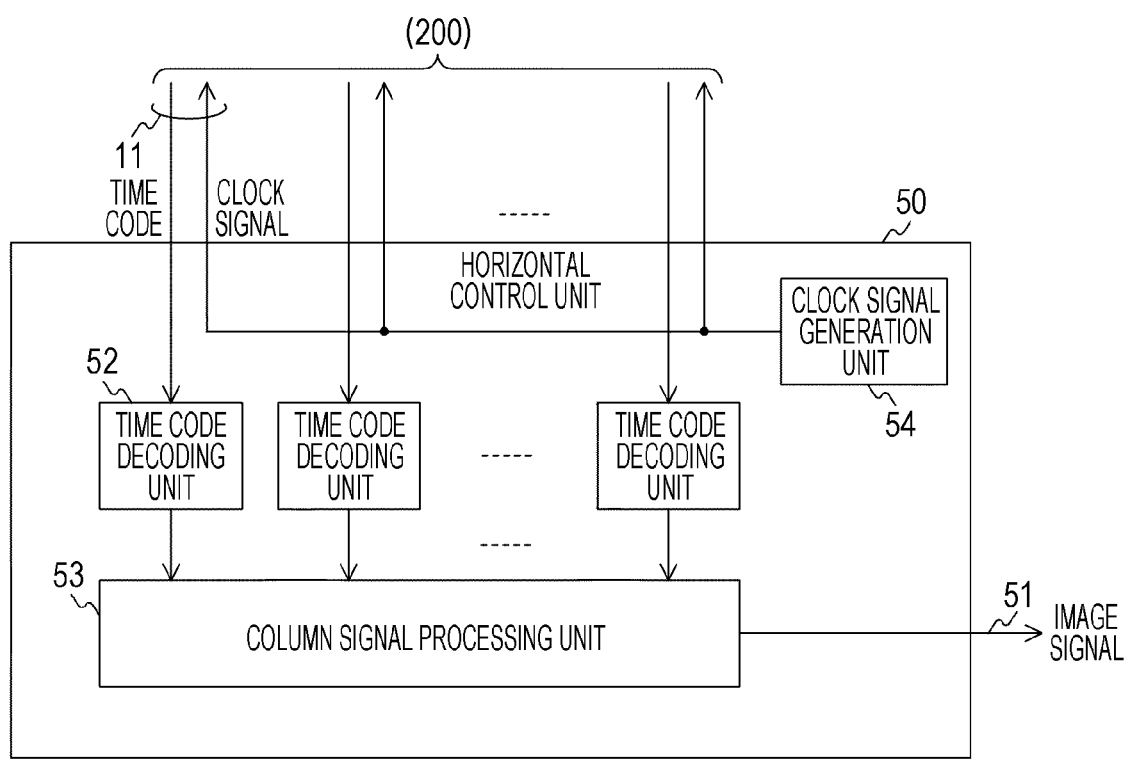
FIG. 2 is a diagram illustrating a configuration example of a horizontal control unit 50 according to the embodiment of the present technology.

FIG. 2 is a diagram illustrating a configuration example of the horizontal control unit 50 according to the embodiment of the present technology. This horizontal control unit 50 is provided with time code decoding units 52, a column signal processing unit 53, and a clock signal generation unit 54.

The time code decoding units 52 decode the time codes. The decoding generates digital image signals that are results of the analog-digital conversion. The plurality of time code decoding units 52 are arranged on the horizontal control unit 50, and one-to-one correspond to the time code transfer units 200 arranged on the pixel array unit 10. The time codes are concurrently input into these time code decoding units 52 from the corresponding time code transfer units 200. The input time codes are concurrently decoded in parallel by these time code decoding units 52. Subsequently, the plurality of decoded digital image signals are input into the column signal processing unit 53. It should be noted that the time code decoding units 52 are an example of the processing circuit set forth in claims.

The column signal processing unit 53 processes the digital image signals output by the time code decoding units 52. As this processing, correlated double sampling (Correlated Double Sampling (CDS)) described later can be performed. In addition, the column signal processing unit 53 subjects the processed digital image signals to horizontal transfer. This means that the processed image signals corresponding to the plurality of digital image signals concurrently input by the plurality of time code decoding units 52 are successively transferred and output. The image signal output from the column signal processing unit 53 corresponds to an output image signal of the image pickup device 1.

[Configuration of Pixel]

Figure 3:
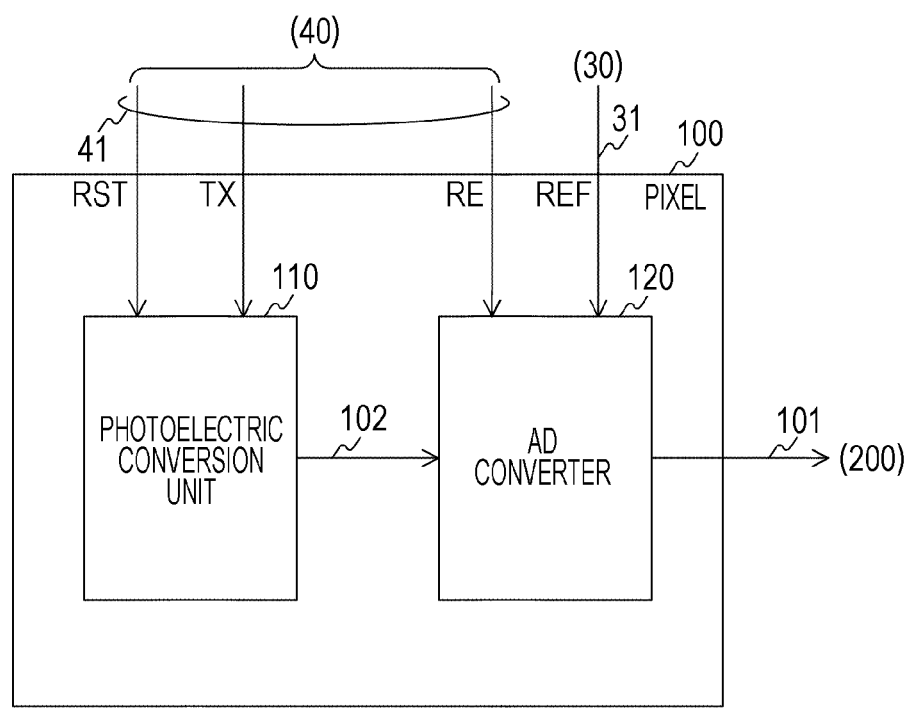
FIG. 3 is a diagram illustrating a configuration example of a pixel 100 according to the embodiment of the present technology.

FIG. 3 is a diagram illustrating a configuration example of the pixel 100 according to the embodiment of the present technology. This pixel 100 is provided with a photoelectric conversion unit 110, and an analog-digital conversion unit (AD converter) 120.

The photoelectric conversion unit 110 performs photoelectric conversion, and generates an analog image signal corresponding to incident light. This photoelectric conversion unit 110 is provided with: a photoelectric conversion element that generates an electrical charge corresponding to emitted light; and an electrical charge holding unit that holds the generated electrical charge. A signal corresponding to the electrical charge held by the electrical charge holding unit is output to the analog-digital conversion unit 120 as an analog image signal. In this case, the analog image signal is output through a signal line 102. In addition, among the signal lines 41, a reset signal line RST (Reset) and a transfer signal line TX (Transfer) are wired to the photoelectric conversion unit 110. The reset signal line RST is a signal line that conveys a control signal for resetting the pixel 100 arranged on the pixel array unit 10. When this control signal is input, an electrical charge held by the above-described electrical charge holding unit is discharged, and consequently resetting is carried out. In addition, the transfer signal line TX is a signal line that conveys a control signal for causing the analog image signal, which has been generated in the pixel 100 arranged on the pixel array unit 10, to be output. When this control signal is input, the electrical charge generated by the above-described photoelectric conversion element is transferred to the electrical charge holding unit, and is then held therein.

The analog-digital conversion unit 120 subjects the analog image signal generated by the photoelectric conversion unit 110 to analog-digital conversion. This analog-digital conversion unit 120 performs analog-digital conversion by being controlled by the vertical drive unit 40, and outputs a digital image signal after conversion to the time code transfer unit 200 through the signal line 101. In addition, the signal line 31 (hereinafter referred to as a reference signal line REF (Reference)) and a read signal line Read Enable (RE) are wired to the analog-digital conversion unit 120. The read signal line RE is a signal line included in the signal lines 41, and is a signal line that conveys a control signal for reading a digital image signal after analog-digital conversion from the analog-digital conversion unit 120.

[Configuration of Analog-Digital Conversion Unit]

Figure 4:
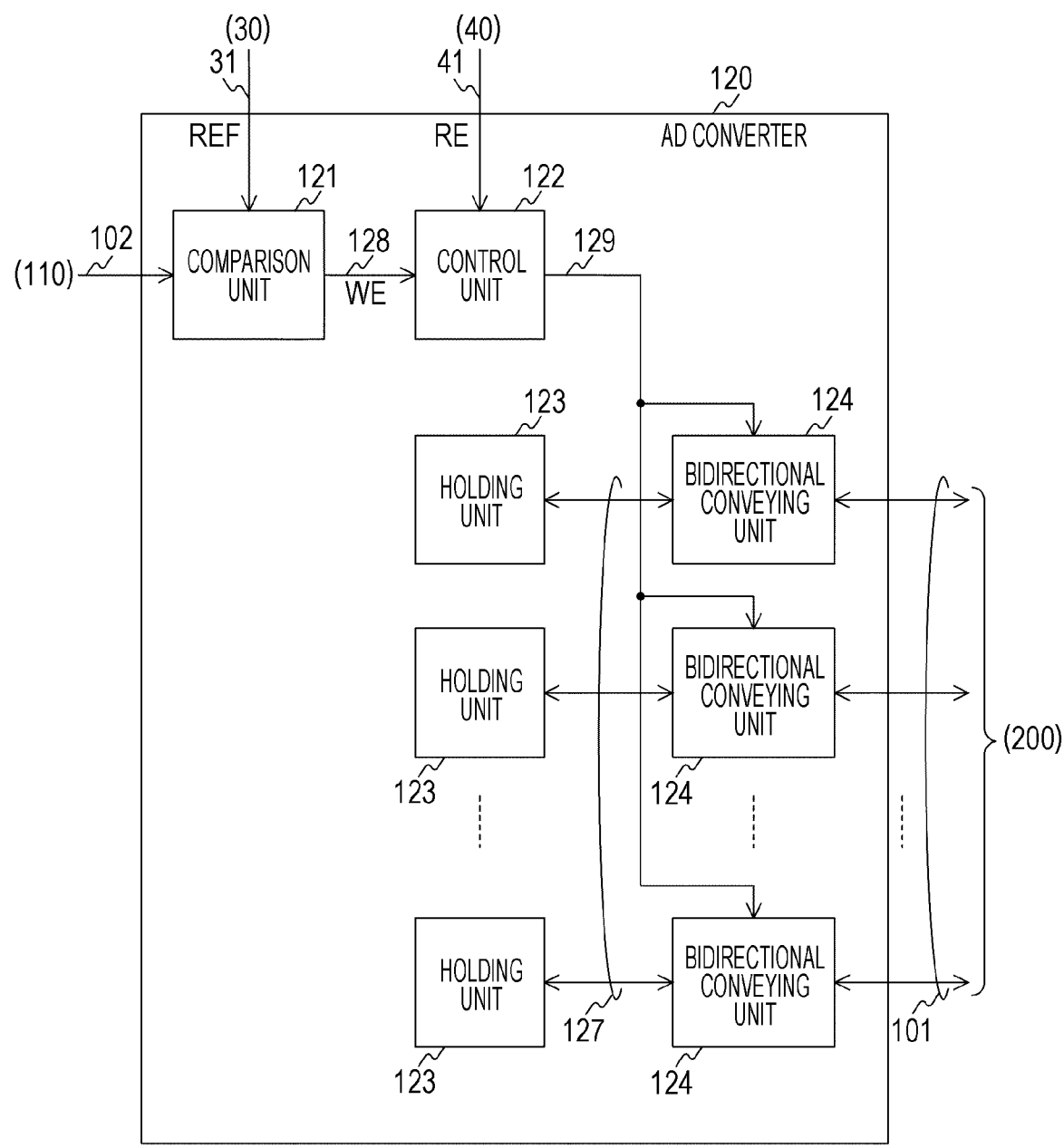
FIG. 4 is a diagram illustrating a configuration example of an analog-digital conversion unit 120 according to the embodiment of the present technology.

FIG. 4 is a diagram illustrating a configuration example of the analog-digital conversion unit 120 according to the embodiment of the present technology. This analog-digital conversion unit 120 is provided with a comparison unit 121, a control unit 122, a holding unit 123, and a bidirectional conveying unit 124. Incidentally, the holding units 123 and the bidirectional conveying units 124 are arranged on the analog-digital conversion unit 120, the number of the holding units 123 and the number of the bidirectional conveying units 124 being equivalent to the number of bits of the time code described in FIG. 1.

The comparison unit 121 compares the analog image signal output from the pixel 100 with the reference signal. A result of the comparison is output to the control unit 122 and the holding unit 123 through the signal line 128 (hereinafter referred to as a write signal line Write Enable (WE)). For example, in a case where a voltage of the analog image signal output from the pixel 100 is higher than a voltage of the reference signal, this comparison unit 121 outputs a signal having a value of "1".

The control unit 122 generates an On signal of the bidirectional conveying unit 124 on the basis of the result of the comparison output from the comparison unit 121, and the control signal conveyed by the read signal line RE. The generated ON signal is output to the plurality of bidirectional conveying units 124 through a signal line 129. A configuration of the control unit 122 will be described later in detail.

The holding unit 123 holds the time code input by the bidirectional conveying unit 124 in the timing in which the result of the comparison output from the comparison unit 121 has changed. As described above, the holding units 123, the number of which is equivalent to the number of bits of the time code, are arranged, and hold 1-bit time codes respectively. In addition, the holding units 123 further output the time codes that are held. These time codes are input and output through respective signal lines 127, each of which is arranged between the holding unit 123 and the bidirectional conveying unit 124. A configuration of the holding unit 123 will be described later in detail.

The bidirectional conveying unit 124 inputs the time code into the holding unit 123, and outputs the time code held in the holding unit 123. When the time code is input, the time code transferred by the time code transfer unit 200 described in FIG. 1 is input into the holding unit 123 via the signal line 101, the bidirectional conveying unit 124 and the signal line 127. This input time code is held in the holding unit 123. When the time code is output, the time code held in the holding unit 123 is output to the time code transfer unit 200 via the signal line 127, the bidirectional conveying unit 124 and the signal line 101. Subsequently, the time code that has been output is transferred to the time code decoding unit 52 described in FIG. 2. In this manner, the bidirectional conveying unit 124 performs bidirectional conveyance of the time code. In addition, when the ON signal generated by the control unit 122 is input, the bidirectional conveying unit 124 is brought into a bidirectional conducting state. This enables the holding unit 123 to input/output the time code from/to the time code transfer unit 200. A configuration of the bidirectional conveying unit 124 will be described later in detail.

[Configuration of Holding Unit]

Figure 5:
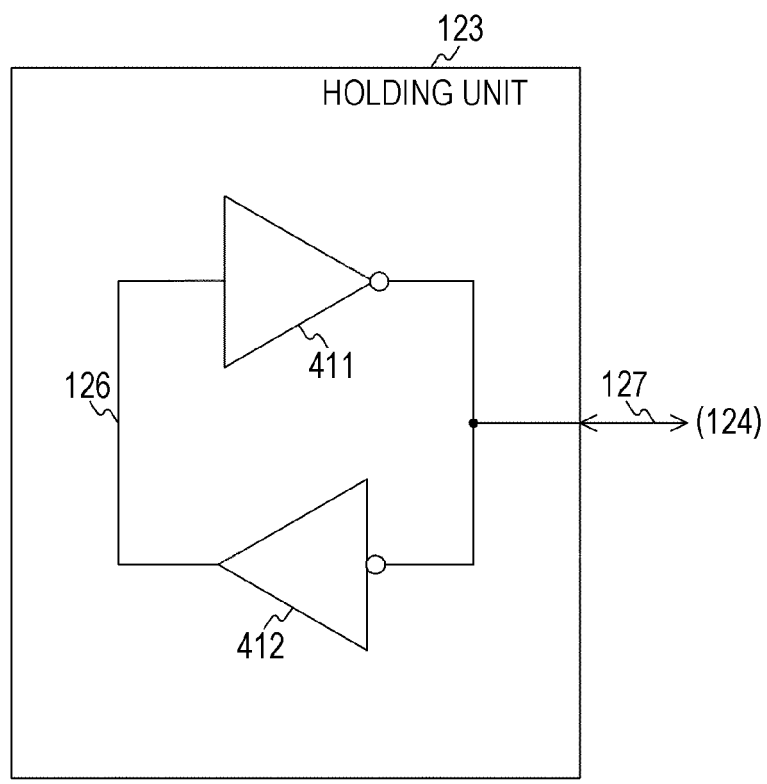
FIG. 5 is a diagram illustrating a configuration example of a holding unit 123 according to the embodiment of the present technology.

FIG. 5 is a diagram illustrating a configuration example of the holding unit 123 according to the embodiment of the present technology. This holding unit 123 is provided with inverting gates 411 and 412.

The output of the inverting gate 411 and the input of the inverting gate 412 are commonly connected to the signal line 127. The input of the inverting gate 411 and the output of the inverting gate 412 are connected to each other by using the signal line 126. The signal line 126 corresponds to a node inside the holding unit 123.

As shown in the same figure, an input terminal of the inverting gate 411 and an output terminal of the inverting gate 412 are connected to each other, and an output terminal of the inverting gate 411 and an input terminal of the inverting gate 412 are connected to each other, so as to form a 1-bit latch. The latch that composes this holding unit 123 holds data (time code) input from the signal line 127, and outputs the held data to the signal line 127.

[Configuration of Bidirectional Conveying Unit]

Figure 6:
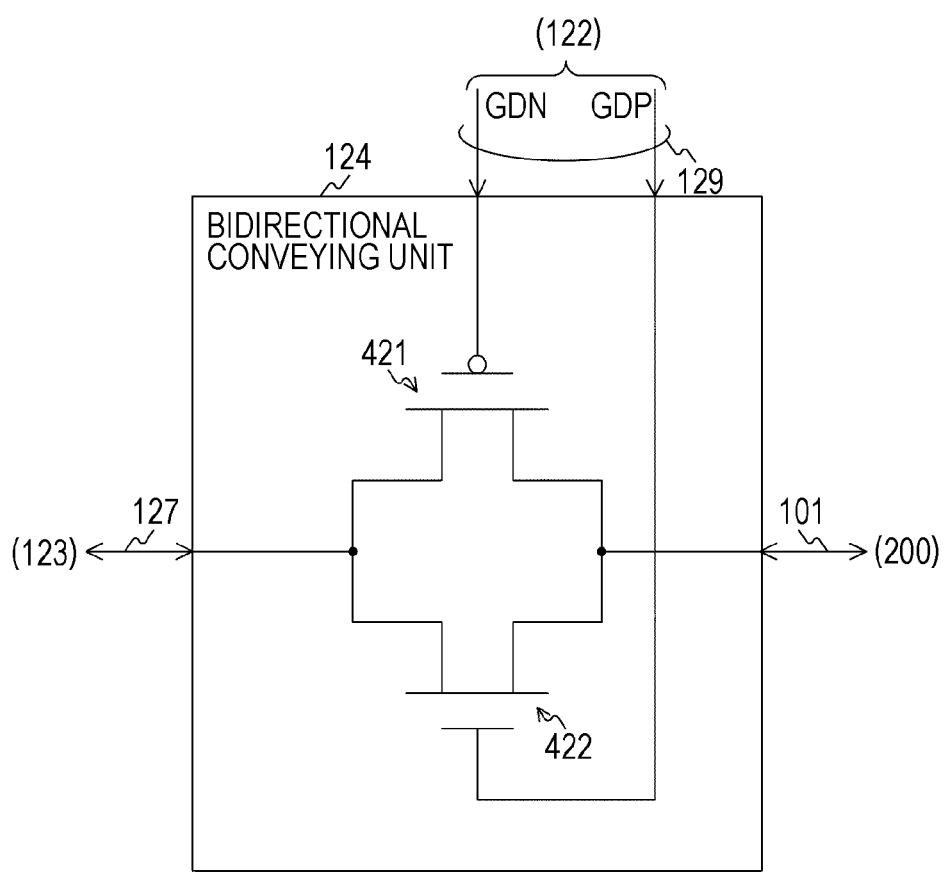
FIG. 6 is a diagram illustrating a configuration example of a bidirectional conveying unit 124 according to a first embodiment of the present technology.

FIG. 6 is a diagram illustrating a configuration example of the bidirectional conveying unit 124 according to the first embodiment of the present technology. This bidirectional conveying unit 124 is provided with a P-channel MOS transistor 421, and a N-channel MOS transistor 422. In addition, the signal lines 129 are wired to the bidirectional conveying unit 124.

The bidirectional conveying unit 124 in the same figure includes a switching element. In the same figure, the MOS transistors 421 and 422, which are connected in parallel, are used as a switching element, and are connected between the signal lines 127 and 101. A P-channel MOS transistor and an N-channel MOS transistor can be used as the MOS transistors 421 and 422 respectively. These MOS transistors 421 and 422 are controlled by the ON signal conveyed through the signal lines 129. The signal lines 129 include a gate driving signal line Gate Drive Negative (GDN), and a gate driving signal line Gate Drive Positive (GDP). The gate driving signal line GDN is a signal line that is connected to a gate of the MOS transistor 421, and conveys the ON signal. The gate driving signal line GDP is a signal line that is connected to a gate of the MOS transistor 422, and conveys the ON signal.

The bidirectional conveying unit 124 in the same figure is formed by connecting the P-channel MOS transistor and the N-channel MOS transistor in parallel, and therefore a signal having a wide range of voltage from the ground potential to a power supply voltage can be bi-directionally conveyed.

In this manner, inputting/outputting into/from the holding unit 123 are performed by the bidirectional conveying unit 124 that includes the two MOS transistors, and therefore the configuration of the AD converter can be simplified. However, since the bidirectional conveying unit 124 is connected to a terminal that is shared by both inputting and outputting in the holding unit 123, there is a case where depending on electric potential of the signal line 101, a malfunction occurs when data (time code) is read from the holding unit 123. This malfunction will be described later in detail.

[Configuration of Control Unit]

Figure 7:
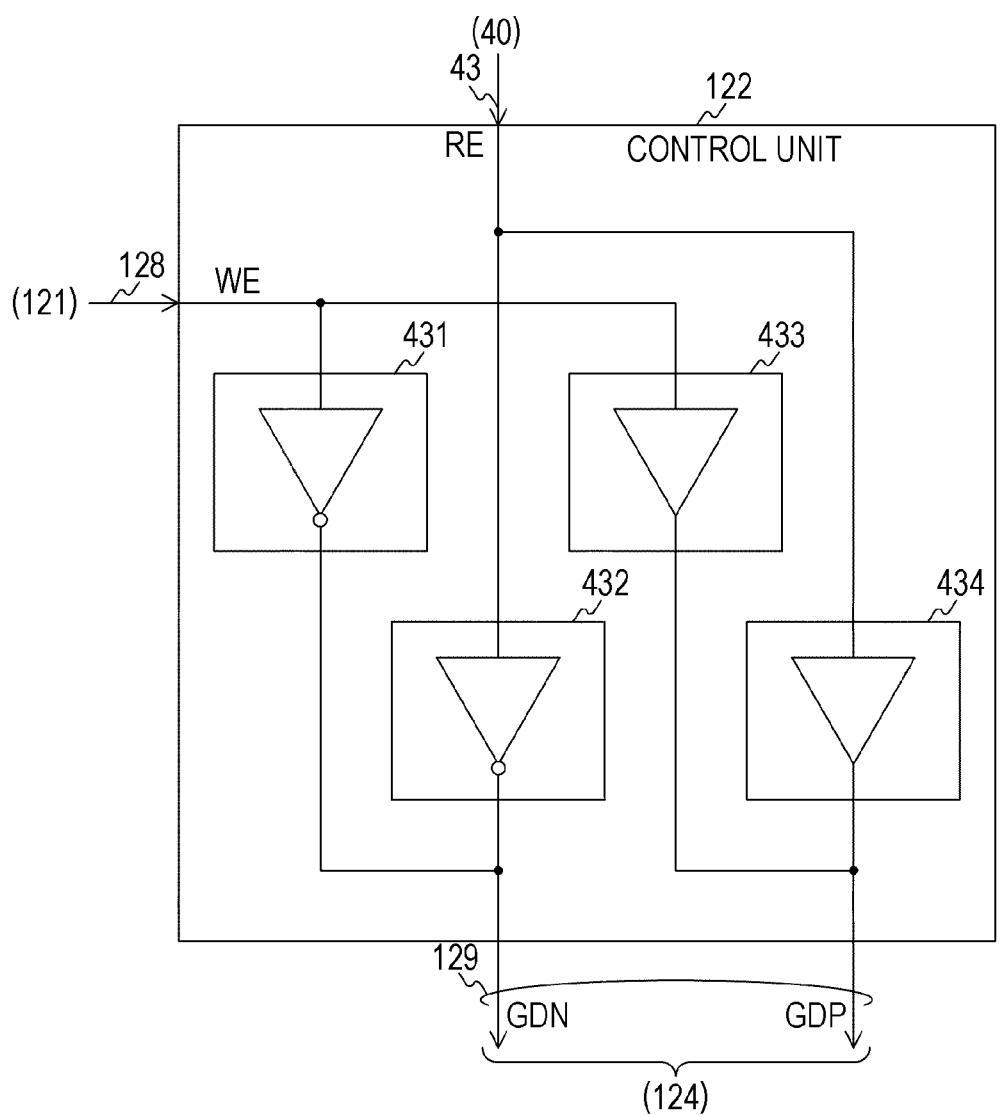
FIG. 7 is a diagram illustrating a configuration example of a control unit 122 according to the first embodiment of the present technology.

FIG. 7 is a diagram illustrating a configuration example of the control unit 122 according to the first embodiment of the present technology. This control unit 122 is provided with inverting type gate driving units 431 and 432, and non-inverting type gate driving units 433 and 434.

The input of the inverting type gate driving unit 431 and the input of the non-inverting type gate driving unit 433 are commonly connected to the write signal line WE. The input of the inverting type gate driving unit 432 and the input of the non-inverting type gate driving unit 434 are commonly connected to the read signal line RE. The outputs of the inverting type gate driving units 431 and 432 are commonly connected to the gate driving signal line GDN. The outputs of the non-inverting type gate driving units 433 and 434 are commonly connected to the gate driving signal line GDP.

The inverting type gate driving units 431 and 432 and the non-inverting type gate driving units 433 and 434 generate ON signals of the MOS transistors on the basis of input signals. The inverting type gate driving units 431 and 432 generate an ON signal of the N-channel MOS transistor. More specifically, the outputs of the inverting type gate driving units 431 and 432 are biased toward the ground voltage at the stationary time, and when a signal is input, a gate driving signal having a voltage, the value of which exceeds a threshold value of the N-channel MOS transistor, is generated as an ON signal, and is then output. Meanwhile, the non-inverting type gate driving units 433 and 434 generate a gate driving signal of the P-channel MOS transistor as an ON signal. More specifically, at the stationary time, the outputs of the non-inverting type gate driving units 433 and 434 are biased toward a voltage of the power supply supplied by a power line Vdd, and when a signal is input, an ON signal having a voltage, the value of which exceeds a threshold value of the P-channel MOS transistor, is generated, and is then output.

As shown in the same figure, the outputs of the inverting type gate driving units 431 and 432 and the outputs of the non-inverting type gate driving units 433 and 434 are wired-OR connected. As such inverting type gate driving units 431 and 432, an inverting buffer having an output unit that includes a transistor to which a pull-down resistor is connected can be used. In addition, as such non-inverting type gate driving units 433 and 434, a non-inverting buffer having an output unit that includes a transistor to which a pull-up resistor is connected can be used.

In addition, the inverting type gate driving unit 432 and the non-inverting type gate driving unit 434 generate an ON signal having a voltage lower than that in the case of the inverting type gate driving unit 431 and the non-inverting type gate driving unit 433. The inverting type gate driving unit 431 and the non-inverting type gate driving unit 433 generate an ON signal on the basis of a signal input from the write signal line WE. Meanwhile, the inverting type gate driving unit 432 and the non-inverting type gate driving unit 434 generate an ON signal on the basis of a signal input from the read signal line RE. As described above, a result of comparison by the comparison unit 121 is output to the write signal line RE. Therefore, in the control unit 122 in the same figure, in comparison with the ON signal that is generated on the basis of a result of comparison by the comparison unit 121, the ON signal that is generated on the basis of a signal input from the read signal line RE has a lower voltage.

[ON Signal]

Figure 8:
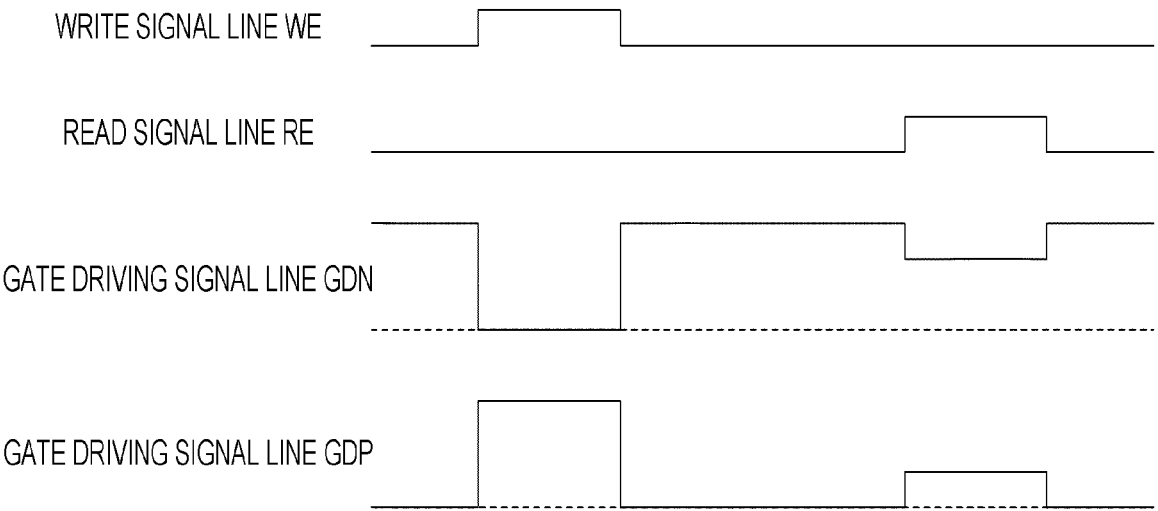
FIG. 8 is a diagram illustrating an example of a gate driving signal according to the first embodiment of the present technology.

FIG. 8 is a diagram illustrating an example of an ON signal according to the first embodiment of the present technology. The same figure illustrates the relationship among input signals of the write signal line WE and the read signal line RE in the control unit 122, and ON signals that are output to the gate driving signal lines GDN and GDP. In the write signal line WE and the read signal line RE shown in the same figure, among binarized signals, a time period during which a value is "1" corresponds to a signal input period during which a signal is input into the inverting type gate driving units 431 and 432 and the non-inverting type gate driving units 433 and 434. In addition, in the same figure, dotted lines each represent the ground voltage.

When a signal is input from the write signal line WE, the inverting type gate driving unit 431 generates an ON signal of the P-channel MOS transistor 421, and outputs the ON signal to the gate driving signal line GDN. As shown in the same figure, this ON signal is a signal having a voltage that is substantially equivalent to the ground voltage. At the same time, the non-inverting type gate driving unit 433 generates an ON signal of the N-channel MOS transistor 422, and outputs the ON signal to the gate driving signal line GDP. As shown in the same figure, this ON signal is a signal having a voltage that is substantially equivalent to the power supply voltage. Therefore, the P-channel MOS transistor 421 and the N-channel MOS transistor 422 are each brought into a conducting state.

In this manner, when the signal of the write signal line WE has a value of "1", the bidirectional conveying unit 124 is brought into a conducting state, and the time code that has been input into the signal line 101 described in FIG. 6 is input into the holding unit 123, and is held therein. Incidentally, in a case where the time code input into the signal line 101 has changed, the changed time code overwrites the time code held in the holding unit 123, and is then held therein. Subsequently, when the value of the signal of the write signal line WE changes to "0", the bidirectional conveying unit 124 is brought into a non-conducting state, and inputting of the time code into the holding unit 123 is stopped. Therefore, the time code held in the holding unit 123 when the value of the signal of the write signal line WE changes to "0" is continuously held without being overwritten. As described in FIG. 4, since the signal of the write signal line WE is a result of comparison by the comparison unit 121, the time code is held in the holding unit 123 in the timing in which the result of the comparison by the comparison unit 121 has changed.

Meanwhile, when a signal is input from the read signal line RE, the inverting type gate driving unit 432 generates an ON signal of the P-channel MOS transistor. A voltage of this ON signal becomes higher than that of the ON signal generated by the above-described inverting type gate driving unit 431. In other words, an ON signal having a low voltage has been generated in the P-channel MOS transistor. At the same time, the non-inverting type gate driving unit 434 generates an ON signal of the N-channel MOS transistor. A voltage of this ON signal becomes lower than that of the ON signal generated by the above-described non-inverting type gate driving unit 433. Therefore, when a signal is input from the read signal line RE, a value of internal resistance of the MOS transistor that composes the bidirectional conveying unit 124 becomes higher than that in the case where a signal is input from the write signal line WE.

As described in FIG. 5, a time period during which a value of "1" is input into the write signal line WE is a time period during which the time code is input into the holding unit 123. Meanwhile, as described in FIG. 3, a control signal for reading a digital image signal from the analog-digital conversion unit 120 is conveyed to the read signal line RE. In other words, the time code held in the holding unit 123 is output during the time period during which the control signal is input into the read signal line RE. Therefore, when the time code is output, the internal resistance of the bidirectional conveying unit 124 becomes higher than that in the case where the time code is input into the holding unit 123. In this manner, the control unit 122 controls the bidirectional conveying unit 124 by generating an ON signal, and then by outputting the ON signal to the bidirectional conveying unit 124. In this case, the control unit 122 controls a value of the internal resistance of the bidirectional conveying unit 124 to differ between a case where the time code is held in the holding unit 123 and a case where the held time code is read from the holding unit 123.

[Configuration of Holding Unit and Bidirectional Conveying Unit]

Figure 9:
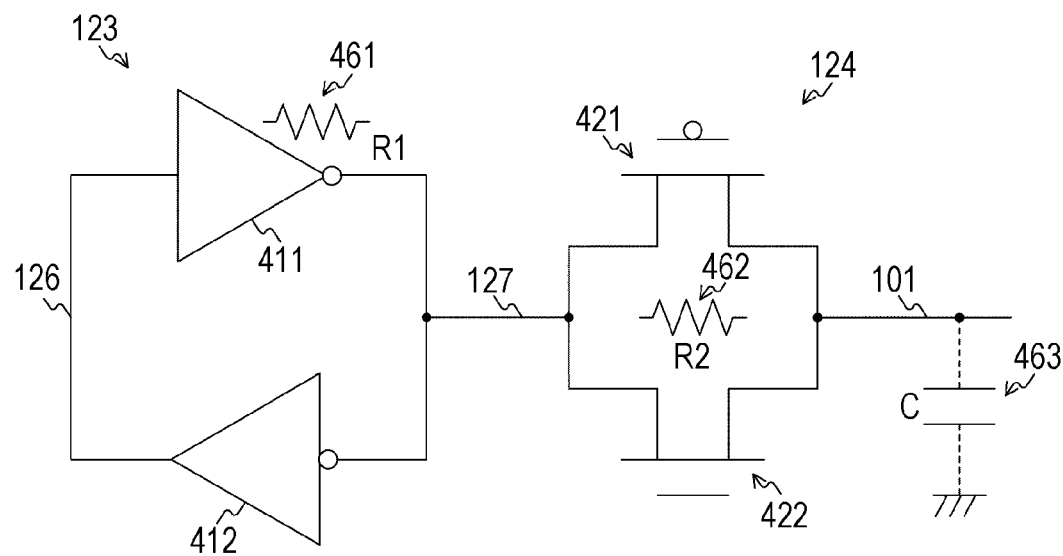
FIG. 9 is a diagram illustrating a configuration example of the holding unit 123 and the bidirectional conveying unit 124 according to the first embodiment of the present technology.

FIG. 9 is a diagram illustrating a configuration example of the holding unit 123 and the bidirectional conveying unit 124 according to the first embodiment of the present technology. In the same figure, a resistance 461 represents resistance of the inverting gate 411. A resistance 462 represents internal resistance of the bidirectional conveying unit 124. A resistance 462 is a combination of internal resistances of the MOS transistors 421 and 422. Here, R1 and R2 represent resistance values of the resistances 461 and 462 respectively. In addition, a stray capacitor 463 is connected to the signal line 101 shown in the same figure. C represents capacitance of this stray capacitor 463.

On the assumption that data (time code) held in the holding unit 123 is read, a driving signal is input into gates of the MOS transistors 421 and 422, and consequently these MOS transistors are brought into a conducting state. As the result, an output voltage of the inverting gate 411, which is a voltage based on data held in the holding unit 123, is output to the signal line 101 via the signal line 127 and the MOS transistors 421 and 422. However, as shown in the same figure, the stray capacitor 463 is connected to the signal line 101. In a case where the voltage of this stray capacitor differs from the voltage based on the data held in the holding unit 123, the inverting gate 411 charges/discharges the stray capacitor 463 through the MOS transistors 421 and 422, and the voltage is output.

On the assumption that the data held in the holding unit 123 has a value of "0", and an output voltage of the inverting gate 411 based on the value is a ground voltage, a voltage of the signal line 101 can be represented by the following equation.

$$V101 = V0 \times \exp(-t/((R1+R2) \times C))$$

Here, V101 represents a voltage of the signal line 101. In addition, V0 represents an initial voltage of the stray capacitor 463. Moreover, t represents the elapsed time after the MOS transistors 421 and 422 have been shifted to the conducting state. A voltage of the signal line 127 can be represented by the following equation.

$$V127 = (R1/(R1+R2)) \times V101$$

Here, V127 represents a voltage of the signal line 127. In this manner, the voltage of the signal line 127 becomes a voltage obtained by dividing the voltage of the signal line 101 by the resistances 461 and 462. The input of the inverting gate 412 is connected to the signal line 127. In a case where the voltage of the signal line 127 is higher than a threshold value of the input of the inverting gate 412, the output of the inverting gate 412 changes, which causes a malfunction. Accordingly, when data is read from the holding unit 123, the internal resistance of the bidirectional conveying unit 124 is increased, thereby causing a voltage applied to the bidirectional conveying unit 124 to become higher than a difference between the initial voltage of the signal line 101 and the threshold value of the input of the inverting gate 412. This enables a malfunction to be prevented.

Operation of Bidirectional Conveying Unit

Figure 10:
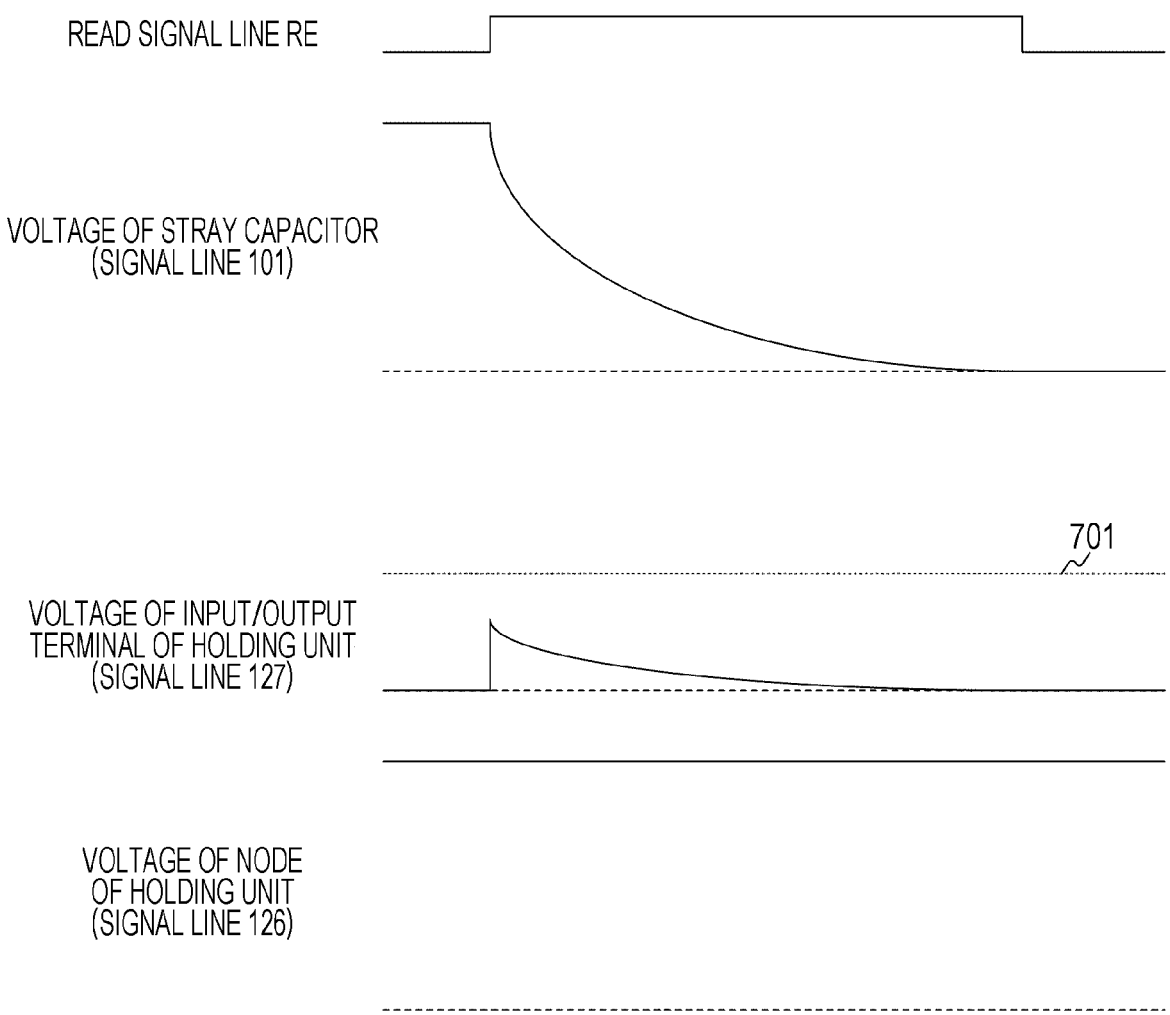
FIG. 10 is a diagram illustrating an example of operation in the bidirectional conveying unit 124 according to the first embodiment of the present technology.

FIG. 10 is a diagram illustrating an example of the operation in the bidirectional conveying unit 124 according to the first embodiment of the present technology. The same figure shows, among the ON signals described in FIG. 8, a signal of the bidirectional conveying unit 124 obtained in a case where data is output from the holding unit 123. In addition, dotted lines shown in the same figure each represent the ground voltage.

When a signal is output to the read signal line RE, and consequently the MOS transistor of the bidirectional conveying unit 124 is brought into a conducting state, a voltage of the signal line 101 decreases. This is because the stray capacitor 463 of the signal line 101 is discharged by the inverting gate 411 of the holding unit 123 described in FIG. 9. As described in FIG. 8, when a signal is input from the read signal line RE, a value of the internal resistance of the MOS transistor that composes the bidirectional conveying unit 124 becomes high. Therefore, in comparison with the case where a signal is input from the write signal line WE, the greater part of voltage of the signal line 101 is applied to the bidirectional conveying unit 124. A graph 701 shown in the same figure indicates a threshold value of the input of the inverting gate 412, and the signal line 127 can be adapted to have a voltage lower than this threshold value. Therefore, the output of the inverting gate 412 does not change, and the voltage of the node of the holding unit 123 does not change either. In this manner, by causing the internal resistance of the bidirectional conveying unit 124, which is obtained when outputting from the holding unit 123 is performed, to become relatively high, it is possible to prevent a malfunction from occurring when the time code is read from holding unit 123.

[Another Example of ON Signal]

Figure 11:
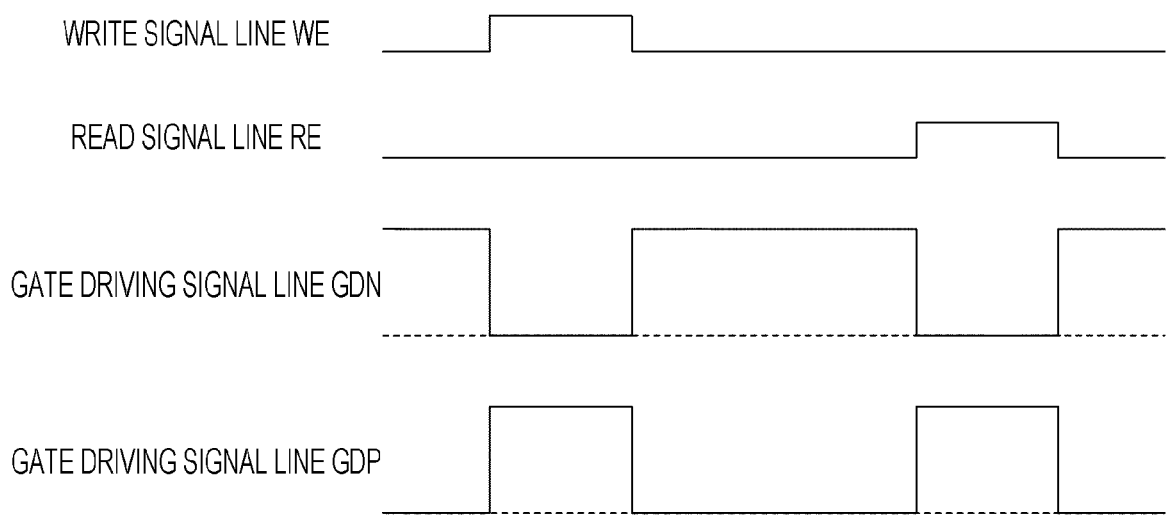
FIG. 11 is a diagram illustrating another example of a gate driving signal according to the first embodiment of the present technology.

FIG. 11 is a diagram illustrating another example of an ON signal according to the first embodiment of the present technology. The same figure shows an example taken for the comparison with the ON signal described in FIG. 8. In the same figure, the ON signal differs from the ON signal described in FIG. 8 in that a gate driving voltage obtained when the control signal is input from the read signal line RE is high.

[Another Example of Operation of Bidirectional Conveying Unit]

Figure 12:
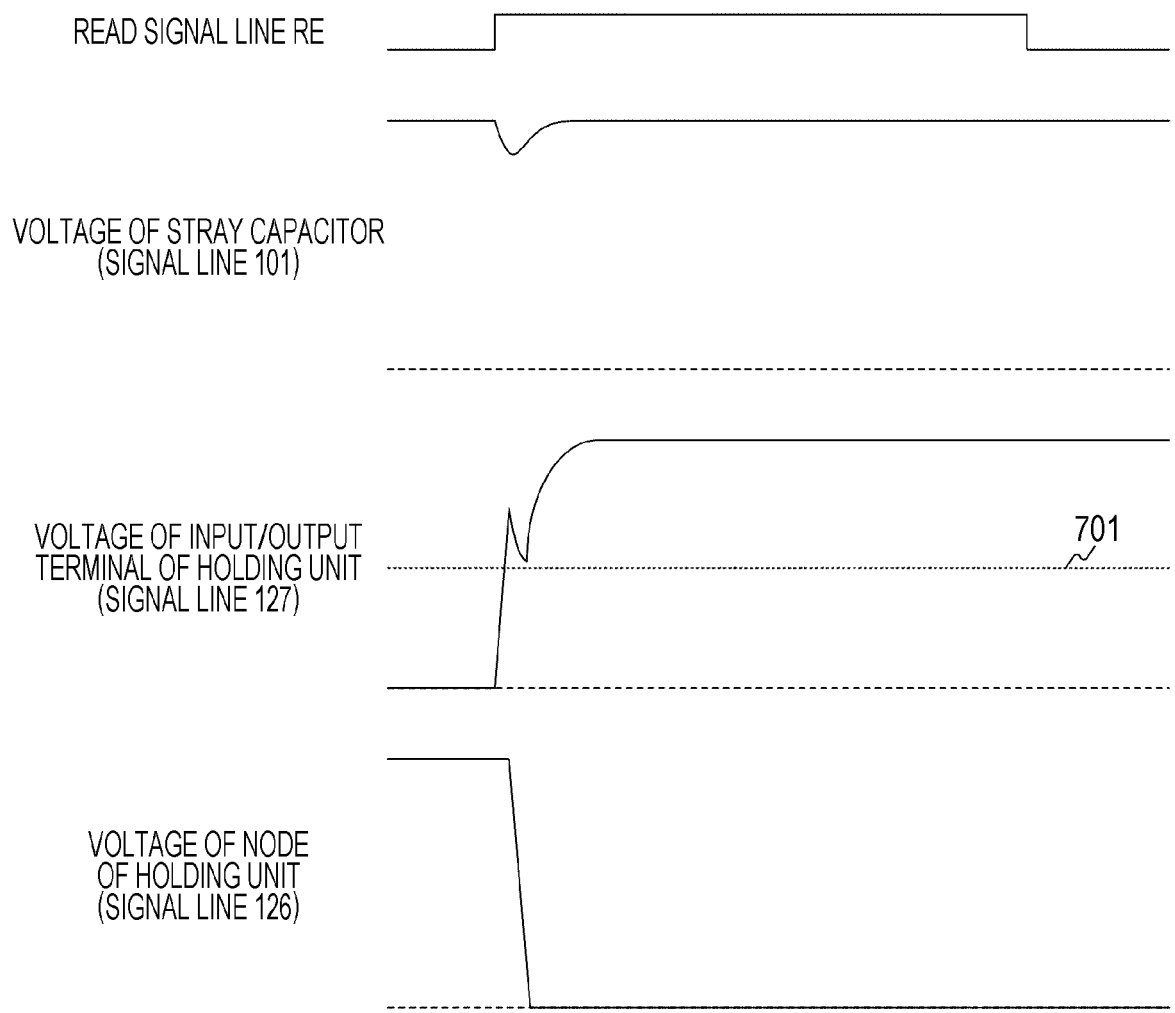
FIG. 12 is a diagram illustrating another example of operation in the bidirectional conveying unit 124 according to the first embodiment of the present technology.

FIG. 12 is a diagram illustrating another example of the operation in the bidirectional conveying unit 124 according to the first embodiment of the present technology. The same figure differs from the example described in FIG. 10 in that the ON signal described in FIG. 11 is input.

In the same figure, since the gate driving voltage obtained when the control signal is input from the read signal line RE is high, the internal resistance (resistance 462) of the bidirectional conveying unit 124 decreases, which causes the voltage of the input/output terminal of the holding unit 123 to exceed a threshold value. Therefore, the output of the inverting gate 412 is inverted, and consequently the voltage of the node of the holding unit 123 is inverted. Therefore, a value that differs from the value held in the holding unit 123 is output, which causes a malfunction.

[Processing in Pixel 100]

Figure 13:
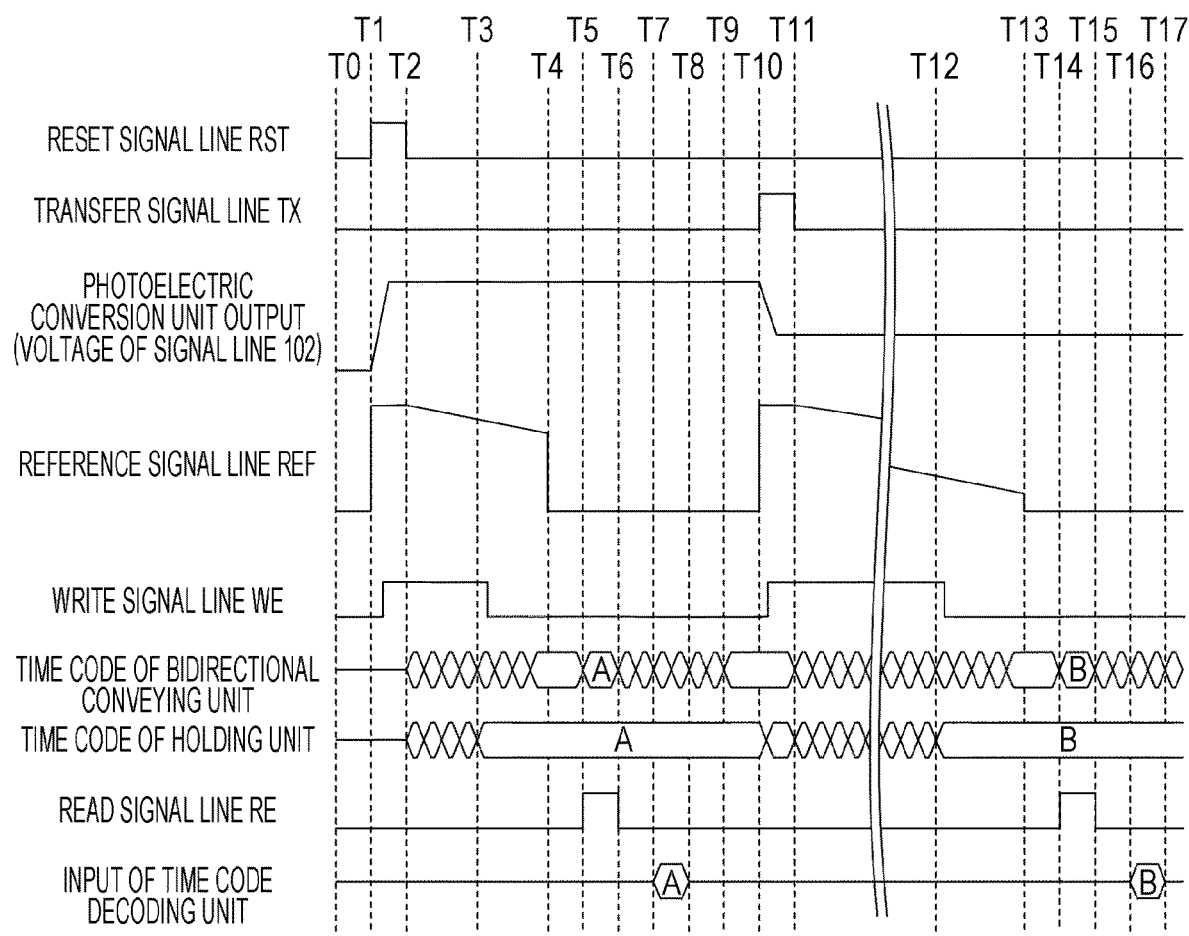
FIG. 13 is a diagram illustrating an example of processing in the pixel 100 according to the first embodiment of the present technology.

FIG. 13 is a diagram illustrating an example of processing in the pixel 100 according to the first embodiment of the present technology. In the same figure, the reset signal line RST, the transfer signal line TX, the write signal line WE, and the read signal line RE represent signals conveyed by the respective signal lines. With respect to these signals, a time period during which a binarized signal has a value of "1" represents a signal input period. A photoelectric conversion unit output and a reference signal line REF represent an output voltage of the photoelectric conversion unit 110 and a voltage of a reference signal respectively. A time code of the bidirectional conveying unit represents a time code that is exchanged between the time code transfer unit 200 and the bidirectional conveying unit 124. A time code of the holding unit represents a time code that is held in the holding unit 123. A time code decoding unit input represents a time code that is input into the time code decoding unit 52. These waveforms represent a time code that includes a plurality of bits.

During a time period from T0 to T1, no control signal is input into the reset signal line RST and the transfer signal line TX. This time period corresponds to a light exposure time period during which photoelectric conversion is performed by the photoelectric conversion element of the photoelectric conversion unit 110. In addition, since no signal is input into the write signal line WE and the read signal line RE, the bidirectional conveying unit 124 is brought into a non-conducting state.

During a time period from T1 to T2, a signal is input into the reset signal line RST, and consequently the photoelectric conversion unit 110 is reset. The output of the photoelectric conversion unit 110 has a voltage that corresponds to an image signal at the time of resetting. In addition, a reference signal is output to the reference signal line REF. The voltage of the reference signal is higher than that of the image signal at the time of resetting, and therefore the output of the comparison unit 121 has a value of "1". This value is output to the write signal line WE.

During a time period from T2 to T4, the voltage of the reference signal decreases in a ramp-shaped manner. At the same time, a transfer of the time code by the time code transfer unit 200 is started, and the time code is output to the signal line 101. The write signal line WE has a value of "1", and therefore, via the bidirectional conveying unit 124 and the signal line 127, the time code is input into the holding unit 123, and is held therein. It should be noted that the time code held during a time period during which the write signal line WE has a value of "1" is overwritten by a time code that is newly input (from T2 to T3). Subsequently, when the voltage of the reference signal becomes lower than the output voltage of the photoelectric conversion unit 110 (T3), the write signal line WE has a value of "0". In other words, the comparison unit 121 compares the voltage of the reference signal with the output voltage of the photoelectric conversion unit 110, and as the result of the comparison, a value of the output changes from "1" to "0". Consequently, the bidirectional conveying unit 124 is brought into a non-conducting state, and the time code that has been input when a value of the write signal line WE has changed to "0" is continuously held in the holding unit 123. In the same figure, this time code is represented by a value of "A". This time code corresponds to the image signal at the time of resetting.

During a time period from T4 to T5, the output of the reference signal is stopped, and consequently the reference signal line REF has a voltage of 0 V. At the same time, the transfer of the time code is also stopped.

During a time period from T5 to T6, a signal is input into the read signal line RE. As the result, the bidirectional conveying unit 124 outputs the time code ("A"), which is held in the holding unit 123, to the signal line 101.

During a time period from T6 to T10, the time code transfer unit 200 transfers the time code that is output to the signal line 101. This transferred time code is held in the time code decoding unit 52 (from T7 to T8). Subsequently, the transfer of the time code is stopped (T9).

During a time period from T10 to T11, a control signal is input into the transfer signal line TX, and an electrical charge generated by the photoelectric conversion element in the photoelectric conversion unit 110 is transferred to the electrical charge holding unit. Subsequently, an image signal based on the transferred electrical charge is output from the photoelectric conversion unit 110. In addition, a reference signal is output to the reference signal line REF, and consequently the write signal line WE has a value of "1". Incidentally, when the input of the control signal into the transfer signal line TX is stopped, a new light exposure time period is started in the photoelectric conversion unit 110.

During a time period from T11 to T13, the voltage of the reference signal decreases, and consequently a transfer of the time code is started. As with the time period from T2 to T4 described above, when the voltage of the reference signal becomes lower than the output voltage of the photoelectric conversion unit 110 (T12), the write signal line WE has a value of "0", and the time code that has been input is continuously held in the holding unit 123. In the same figure, this time code is represented by a value of "B". This time code corresponds to an image signal corresponding to light with which the photoelectric conversion unit 110 is irradiated. It should be noted that as with the time period from T2 to T3 described above, during a time period from T11 to T12, overwriting of the time code occurs in the holding unit 123.

During a time period from T13 to 114, the output of the reference signal is stopped. Consequently, the reference signal line REF has a voltage of 0 V, and the transfer of the time code is also stopped.

During a time period from 114 to T15, a control signal is input into the read signal line RE. As the result, the bidirectional conveying unit 124 outputs the time code ("B"), which is held in the holding unit 123, to the signal line 101.

During a time period from T15 to T17, the time code that has been output to the signal line 101 is transferred, and is then input into the time code decoding unit 52 (from T16 to T17). Subsequently, the time code decoding unit 52 calculates a different between a digital image signal corresponding to the time code "A" that is being held and a digital image signal corresponding to the time code "B". CDS is then executed.

By the processing described above, the generation of the image signal of the pixels 100 arranged in one row in the pixel array unit 10 ends. By executing this processing for all rows, image signals covering one screen can be generated.

In this manner, according to the first embodiment of the present technology, the bidirectional conveying unit 124 inputs/outputs the digital image signal into/from the holding unit 123. In addition, when the digital image signal is read from the holding unit 123, the control unit 122 controls the internal resistance of the bidirectional conveying unit 124 so as to increase a value of the internal resistance. As the result, the digital image signal can be input/output into/from the holding unit 123 by simple control.

Modified Example

In the above-described embodiment, when outputting from the holding unit 123 is performed, the ON signal of the MOS transistor of the bidirectional conveying unit 124 is changed to the low voltage. However, the transition time of the ON signal may be lengthened. The modified example differs from the above-described embodiment in that as an alternative to the voltage of the ON signal, the transition time is changed.

Figure 14:
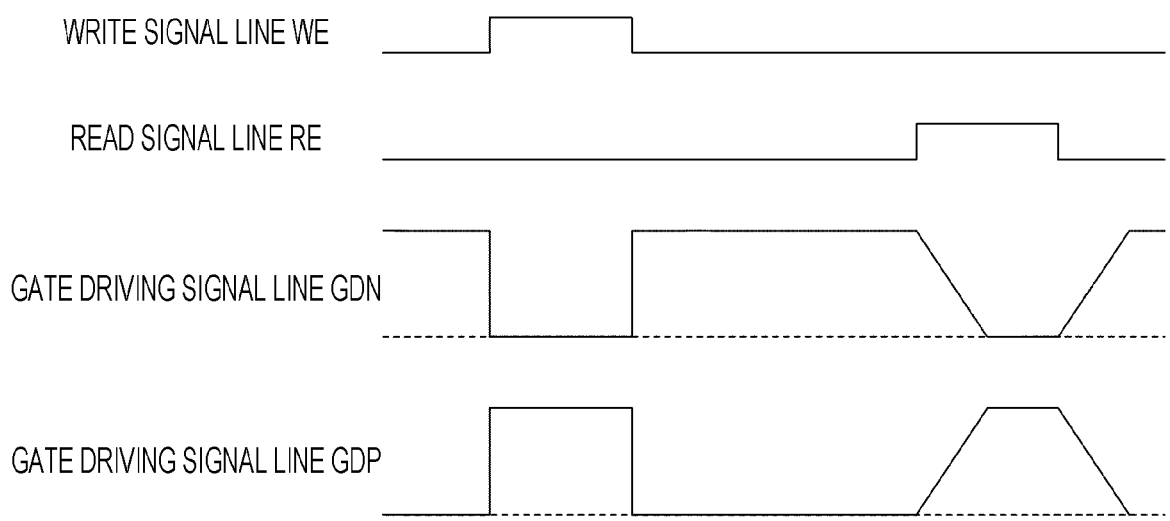
FIG. 14 is a diagram illustrating an example of a gate driving signal in a modified example according to the first embodiment of the present technology.

FIG. 14 is a diagram illustrating an example of an ON signal in a modified example according to the first embodiment of the present technology. The ON signal illustrated in the same figure differs from the ON signal described in FIG. 8 in that the transition time of a waveform at the time of outputting data (the time code) from the holding unit 123 is long, and a voltage is high. In addition, the inverting type gate driving unit 432 and the non-inverting type gate driving unit 434 in the control unit 122 in the modified example according to the first embodiment of the present technology generate an ON signal, the transition time of which is long. For example, gate drive units each having a low load driving capability are employed as the inverting type gate driving unit 432 and the non-inverting type gate driving unit 434. This enables the transition time of the gate voltage of the MOS transistor to be lengthened.

Figure 15:
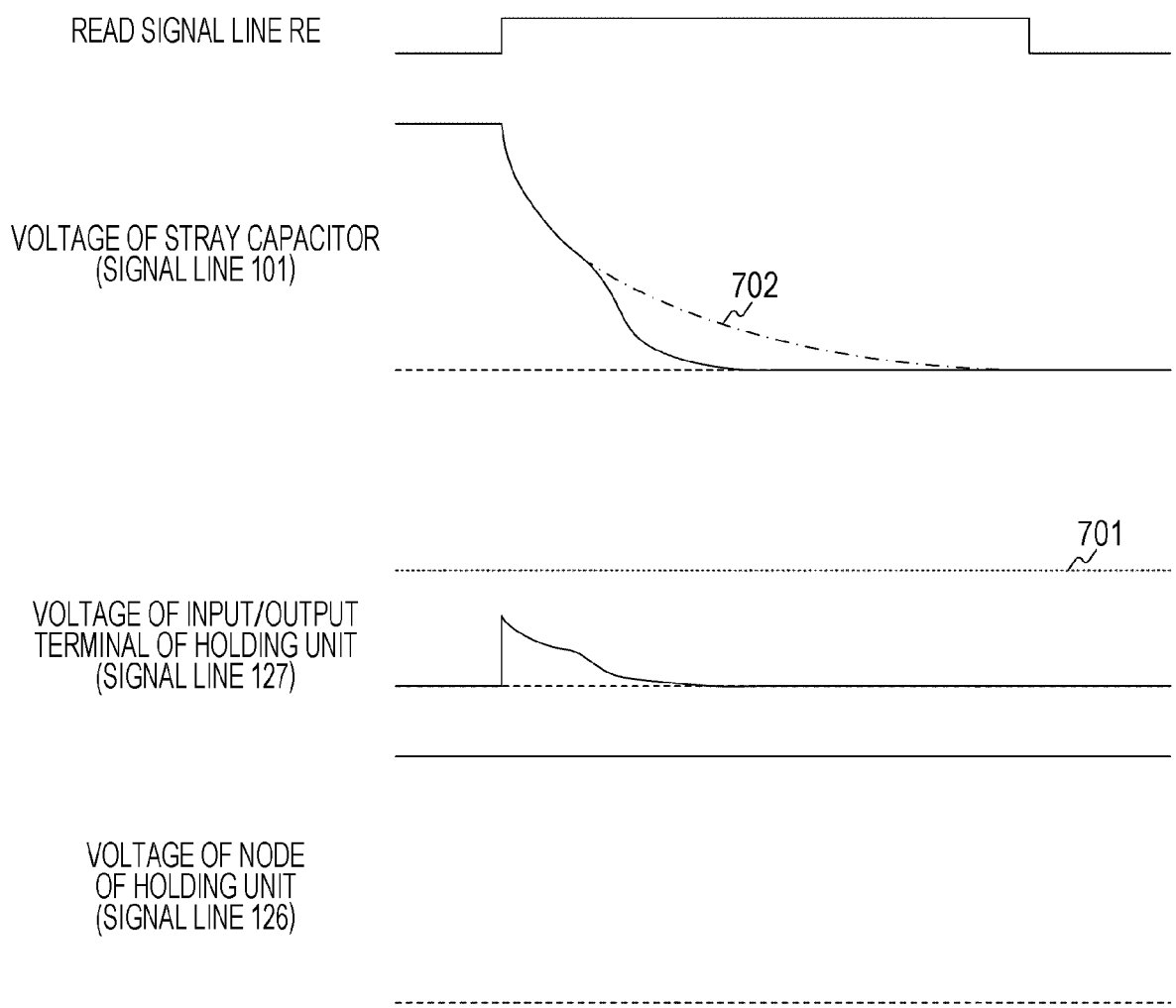
FIG. 15 is a diagram illustrating an example of operation in the bidirectional conveying unit 124 in a modified example according to the first embodiment of the present technology.

FIG. 15 is a diagram illustrating an example of the operation in the bidirectional conveying unit 124 in a modified example according to the first embodiment of the present technology. As with FIG. 10, the same figure illustrates a signal of the bidirectional conveying unit 124 obtained in a case where reading from the holding unit 123 is performed. Since the transition time is long, the time taken by the MOS transistor to make a transition from a non-conducting state to a conducting state gets longer, and therefore a time period during which the internal resistance is high gets relatively longer. Discharging the stray capacitor 463 of the signal line 101 during this time period enables an increase in voltage of the signal line 127 to be suppressed, thereby enabling malfunction to be prevented. After the transition, the voltage of the ON signal can be increased, and therefore the stray capacitor 463 of the signal line 101 can be discharged at high speed, which enables the time required for outputting from the holding unit 123 to be shortened. A graph 702 in the same figure indicates a voltage of the stray capacitor 463 in FIG. 10. In the same figure, the stray capacitor 463 can be discharged at higher speed in comparison with FIG. 10.

In this manner, according to the first modified example of the first embodiment of the present technology, by lengthening the transition time of the ON signal of the MOS transistor in the bidirectional conveying unit 124, outputting of data from the holding unit 123 can be speeded up.

2. Second Embodiment

In the first embodiment described above, the internal resistance is changed by changing the ON signals of the N-channel MOS transistor and the P-channel MOS transistor that are connected in parallel in the bidirectional conveying unit 124. Meanwhile, in the second embodiment of the present technology, a plurality of MOS transistors that differ in internal resistance are arranged, and the plurality of MOS transistors are used by switching therebetween. The second embodiment of the present technology differs from the first embodiment of the present technology in that the MOS transistors that differ in internal resistance are used.

[Configuration of Bidirectional Conveying Unit]

Figure 16:
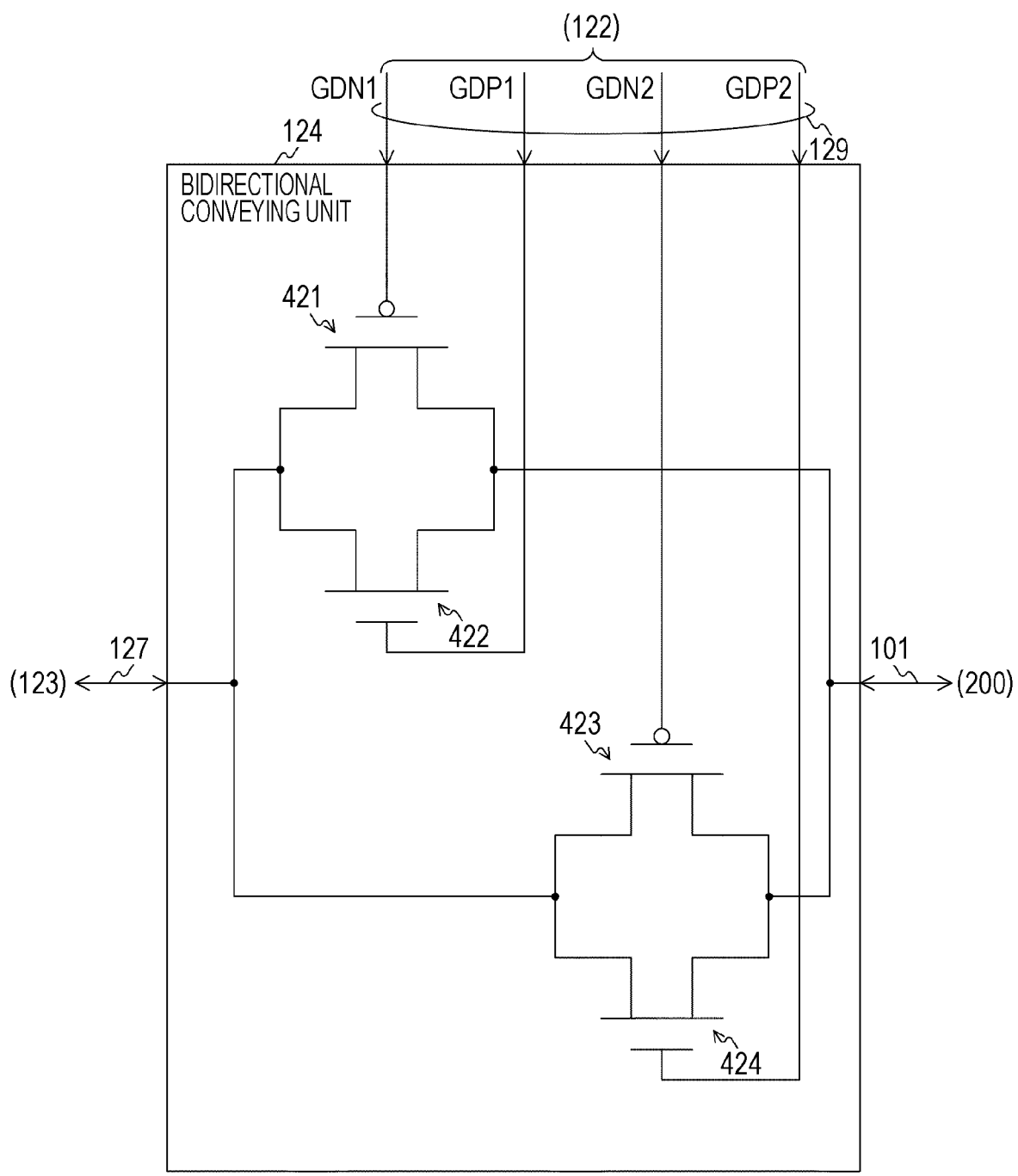
FIG. 16 is a diagram illustrating a configuration example of the bidirectional conveying unit 124 according to a second embodiment of the present technology.

FIG. 16 is a diagram illustrating a configuration example of the bidirectional conveying unit 124 according to the second embodiment of the present technology. The bidirectional conveying unit 124 in the same figure differs from the bidirectional conveying unit 124 described in FIG. 6 in that the bidirectional conveying unit 124 in the same figure is further provided with MOS transistors 423 and 424. A P-channel MOS transistor and an N-channel MOS transistor can be used as the MOS transistors 423 and 424 respectively. Here, MOS transistors, which have higher internal resistances at the time of conduction in comparison with those of the MOS transistors 421 and 422, are used as the MOS transistors 423 and 424. For example, MOS transistors each having a low ratio of channel width to channel length are used as the MOS transistor 423 and 424. In addition, the bidirectional conveying unit 124 in the same figure is provided with gate driving signal lines GDN1, GDN2, GDP1, and GDP2.

The MOS transistors 421, 422, 423, and 424 are connected in parallel, and are connected between the signal lines 127 and 101. The gates of the MOS transistors 421, 422, 423, and 424 are connected to the signal lines GDN1, GDP1, GDN2, and GDP2 respectively.

[Configuration of Control Unit]

Figure 17:
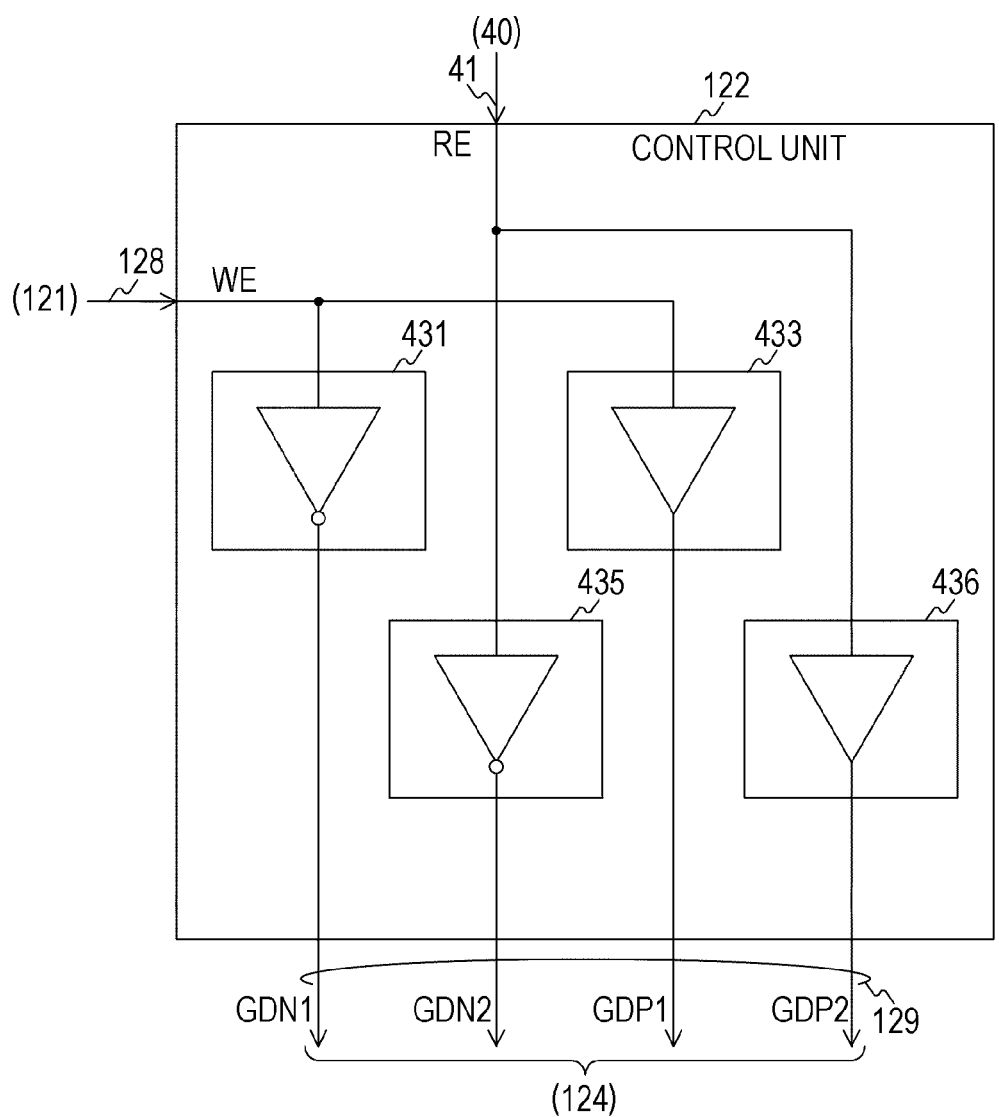
FIG. 17 is a diagram illustrating a configuration example of the control unit 122 according to the second embodiment of the present technology.

FIG. 17 is a diagram illustrating a configuration example of the control unit 122 according to the second embodiment of the present technology. The control unit 122 in the same figure differs from the control unit 122 described in FIG. 7 in that the control unit 122 in the same figure is provided with an inverting type gate driving unit 435 and an non-inverting type gate driving unit 436 as an alternative to the inverting type gate driving unit 432 and the non-inverting type gate driving unit 434. The inverting type gate driving unit 435 and the non-inverting type gate driving unit 436 output ON signals that have the same voltages as those of the inverting type gate driving unit 431 and the non-inverting type gate driving unit 433 respectively. The outputs of the inverting type gate driving units 431 and 435 are connected to the signal lines GDN1 and GDN2 respectively. The outputs of the non-inverting type gate driving units 433 and 436 are connected to the signal lines GDP1 and GDP2. In this manner, the control unit 122 in the same figure can be configured only by gate drive units each generating an ON signal having the same waveform.

[ON Signal]

Figure 18:
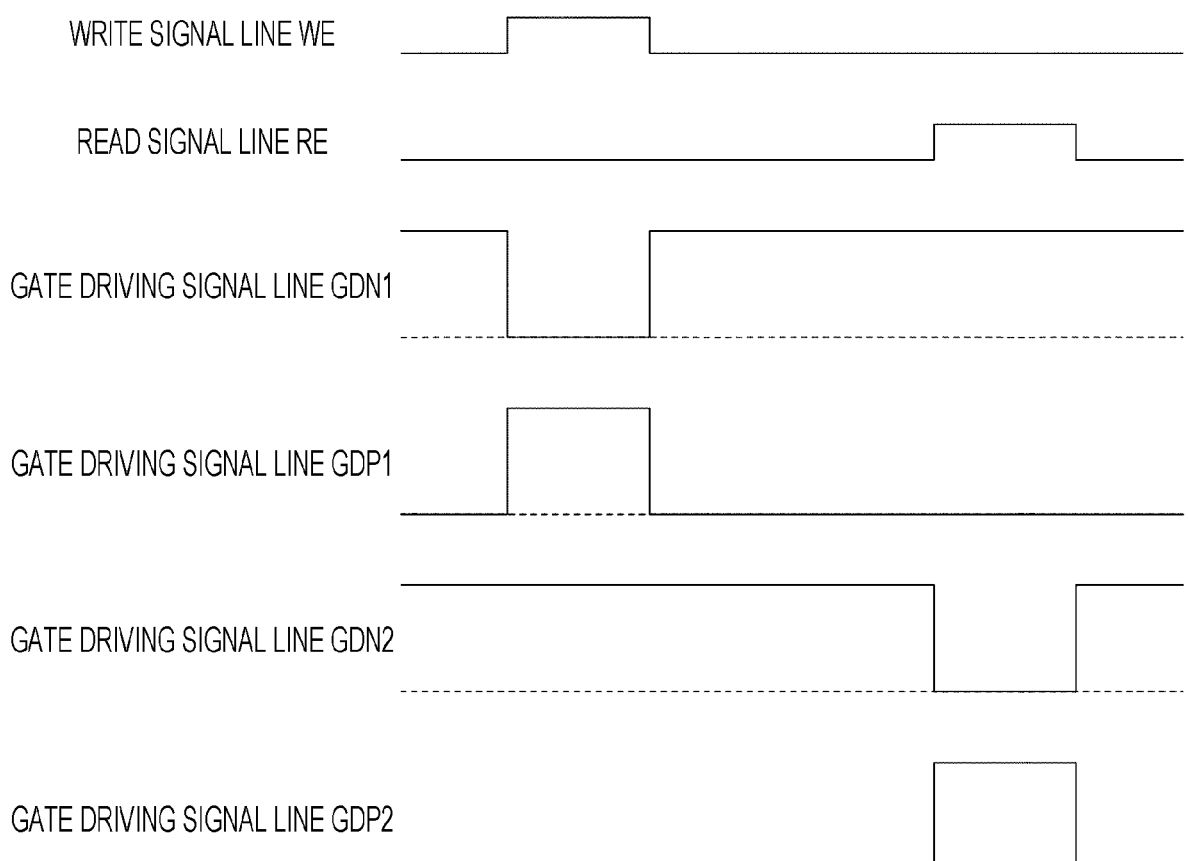
FIG. 18 is a diagram illustrating an example of a gate driving signal according to the second embodiment of the present technology.

FIG. 18 is a diagram illustrating an example of an ON signal according to the second embodiment of the present technology. The same figure illustrates the relationship among input signals of the write signal line WE and the read signal line RE in the control unit 122, and ON signals that are output to the gate driving signal lines GDN1, GDP1, GDN2, and GDP2. When a signal is input from the write signal line WE, an ON signal is output to the gate driving signal lines GDN1 and GDP1. When a signal is input from the read signal line RE, an ON signal is output to the gate driving signal lines GDN2 and GDP2. In this case, waveforms of these ON signals are equivalent to each other. As the result, when a signal is input from the write signal line WE, the MOS transistors 421 and 422 are brought into a conducting state, and when a signal in input from the read signal line RE, the MOS transistors 423 and 424 are brought into a conducting state. As described above, the MOS transistors 423 and 424 each have a high internal resistance at the time of conduction, and therefore the internal resistance of the bidirectional conveying unit 124 can be made high when data is output from the holding unit 123.

The configuration of the image pickup device 1 other than the above is similar to that in the first embodiment of the present technology, and therefore the description thereof will be omitted.

Thus, according to the second embodiment of the present technology, the configuration of the control unit 122 can be simplified by using the plurality of MOS transistors that differ in internal resistance at the time of conduction.

First Modified Example

In the second embodiment described above, the plurality of MOS transistors that differ in internal resistance at the time of conduction are used. Meanwhile, in a first modified example according to the second embodiment of the present technology, the internal resistance is changed by changing the number of MOS transistors that are concurrently brought into a conducting state. The first modified example differs from the second embodiment of the present technology described above in that the MOS transistors each having the same internal resistance are used, and the number of MOS transistors that are concurrently brought into a conducting state differs.

Figure 19:
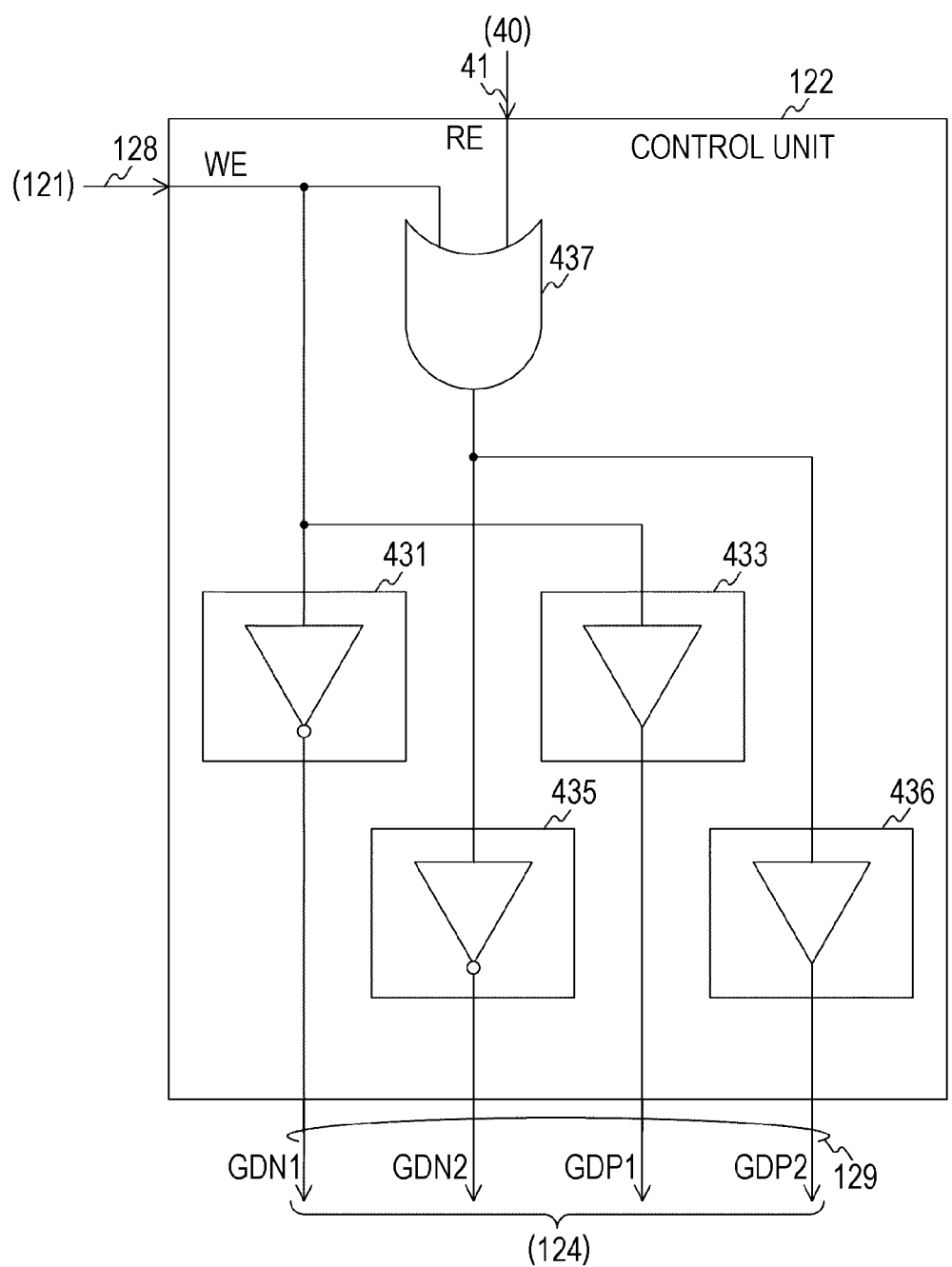
FIG. 19 is a diagram illustrating a configuration example of the control unit 122 in a first modified example according to the second embodiment of the present technology.

FIG. 19 is a diagram illustrating a configuration example of the control unit 122 in the first modified example according to the second embodiment of the present technology. The control unit 122 in the same figure differs from the control unit 122 described in FIG. 17 in that the control unit 122 in the same figure is further provided with an OR gate 437. The write signal line WE and the read signal line RE are connected to the input of the OR gate 437. The output of the OR gate 437 is connected to the input of the inverting type gate driving unit 435 and the input of the non-inverting type gate driving unit 436. The configuration of the control unit 122 other than the above is similar to that of the control unit 122 described in FIG. 17, and therefore the description thereof will be omitted. Incidentally, the bidirectional conveying unit 124 described in FIG. 16 can be used as the bidirectional conveying unit 124. In this case, MOS transistors each having the same internal resistance can be used as the MOS transistor 421 and 423. Similarly, MOS transistors each having the same internal resistance can be used as the MOS transistor 422 and 424.

Figure 20:
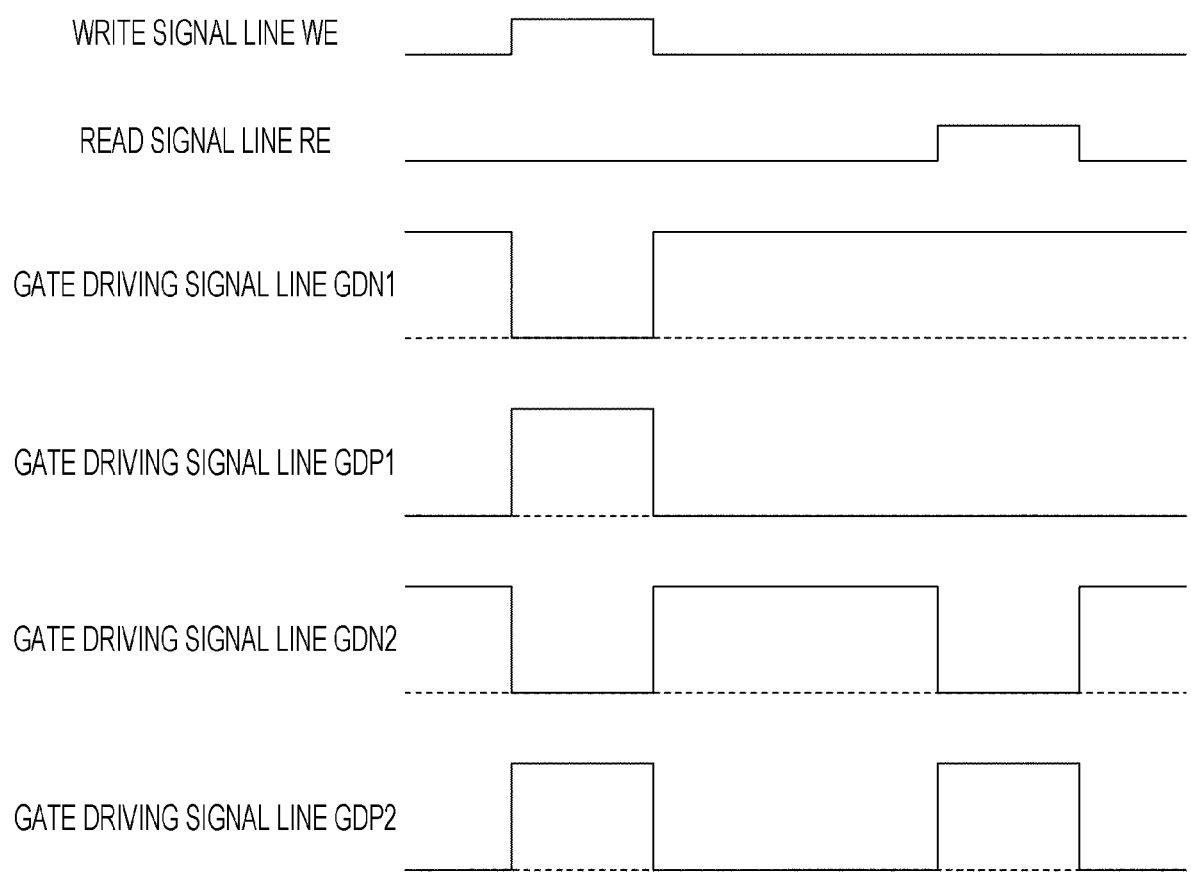
FIG. 20 is a diagram illustrating an example of a gate driving signal in the first modified example according to the second embodiment of the present technology.

FIG. 20 is a diagram illustrating an example of an ON signal in the first modified example according to the second embodiment of the present technology. When a signal is input from the write signal line WE, an ON signal is output to the gate driving signal lines GDN1, GDP1, GDN2, and GDP2. When a signal is input from the read signal line RE, an ON signal is output to the gate driving signal lines GDN2 and GDP2. In this case, waveforms of the ON signals are equivalent to each other. As the result, when a signal is input from the write signal line WE, four MOS transistors of the bidirectional conveying unit 124 are brought into a conducting state, and when a signal is input from the read signal line RE, two MOS transistors are brought into a conducting state. Consequently, the internal resistance of the bidirectional conveying unit 124 can be made high when data is output from the holding unit 123. In this manner, even in a case where MOS transistors each having the same characteristics are used as the MOS transistors 421 to 424, the internal resistance at the time of conduction can be changed.

The configuration of the image pickup device 1 other than the above is similar to that in the first embodiment of the present technology, and therefore the description thereof will be omitted.

Thus, according to the first modified example of the second embodiment of the present technology, the configuration of the bidirectional conveying unit 124 can be simplified by using the MOS transistors each having the same characteristics.

Second Modified Example

In the first modified example of the second embodiment described above, the plurality of P-channel MOS transistors and the plurality of N-channel MOS transistors are used. Meanwhile, in the second modified example according to the second embodiment of the present technology, one P-channel MOS transistor and one N-channel MOS transistor are used. The second modified example differs from the first modified example of the second embodiment described above in that the number of MOS transistors differs.

Figure 21:
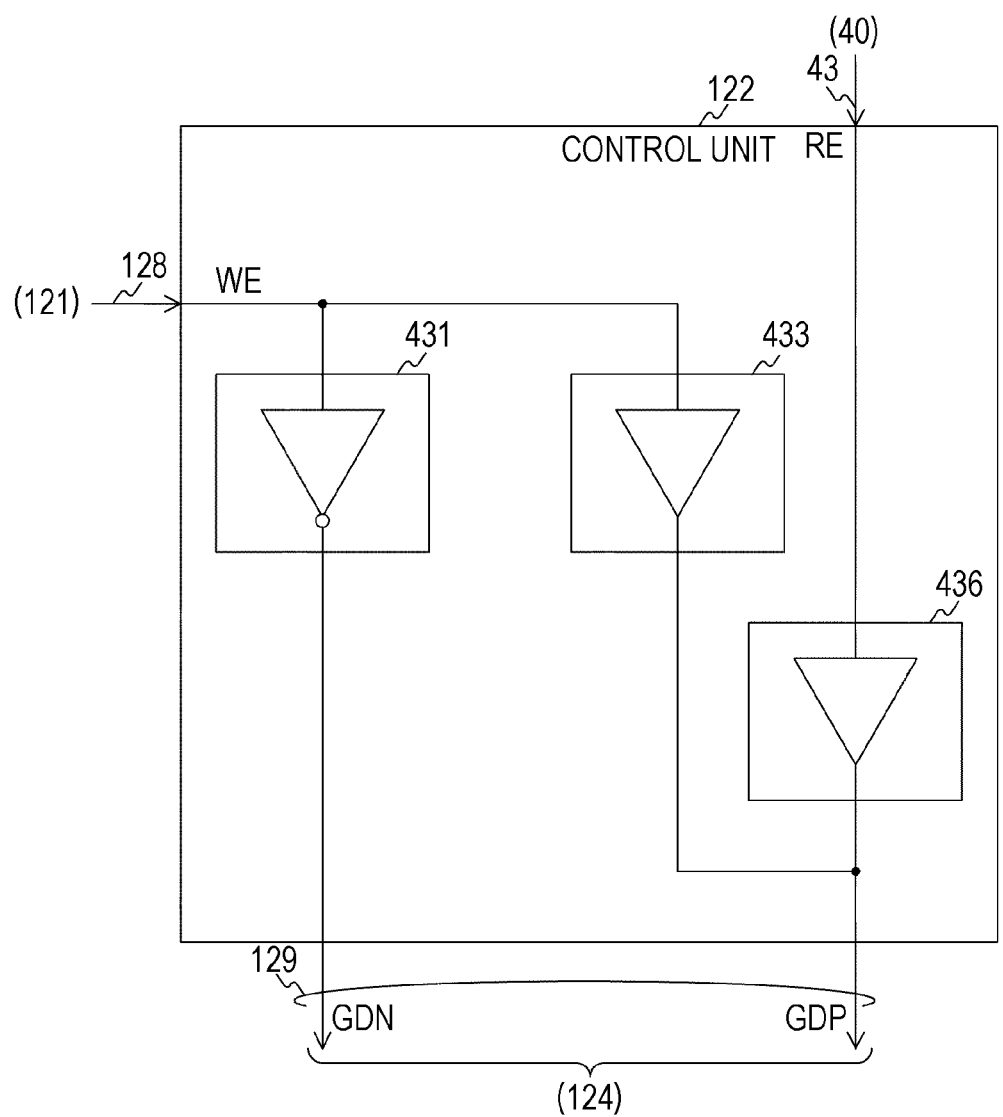
FIG. 21 is a diagram illustrating a configuration example of the control unit 122 in a second modified example according to the second embodiment of the present technology.

FIG. 21 is a diagram illustrating a configuration example of the control unit 122 in the second modified example according to the second embodiment of the present technology. In comparison with the control unit 122 described in FIG. 17, the control unit 122 in the same figure is not required to be provided with the inverting type gate driving unit 435. In addition, the output of the inverting type gate driving unit 431 is connected to the gate driving signal line GDN. The outputs of the non-inverting type gate driving units 433 and 436 are commonly connected to the gate driving signal line GDP. The configuration of the control unit 122 other than the above is similar to that of the control unit 122 described in FIG. 17, and therefore the description thereof will be omitted. Incidentally, the bidirectional conveying unit 124 described in FIG. 6 can be used as the bidirectional conveying unit 124.

Figure 22:
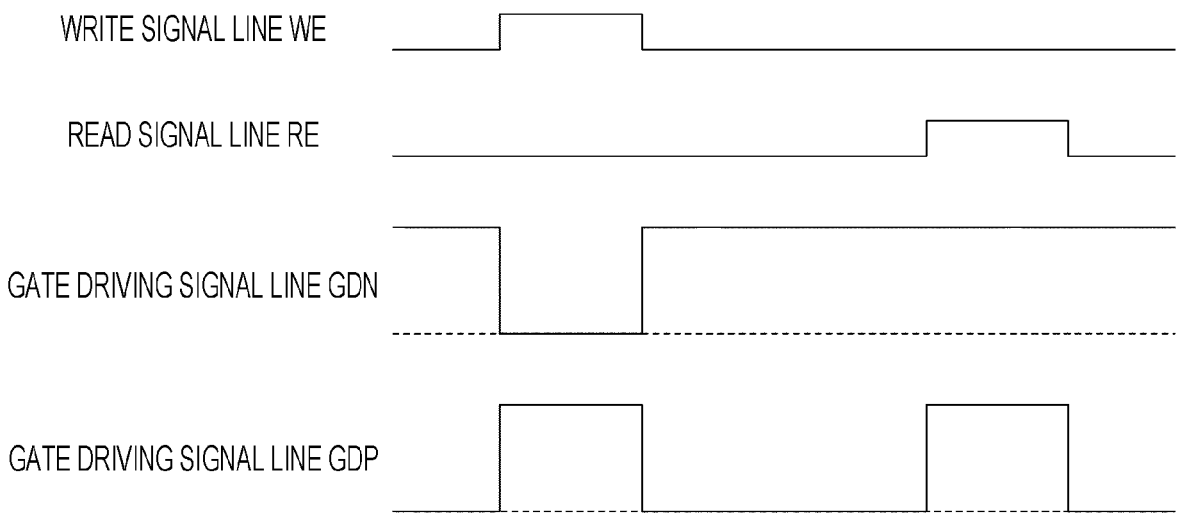
FIG. 22 is a diagram illustrating an example of a gate driving signal in the second modified example according to the second embodiment of the present technology.

FIG. 22 is a diagram illustrating an example of an ON signal in the second modified example according to the second embodiment of the present technology. When a signal is input from the write signal line WE, an ON signal is output to the gate driving signal lines GDN and GDP. When a signal is input from the read signal line RE, an ON signal is output only to the gate driving signal line GDP. As the result, when a signal is input from the write signal line WE, the MOS transistors 421 and 422 of the bidirectional conveying unit 124 are brought into a conducting state, and when a signal is input from the read signal line RE, the MOS transistor 422 is brought into a conducting state. Consequently, the internal resistance of the bidirectional conveying unit 124 can be made high when data is output from the holding unit 123.

It should be noted that when data is output from the holding unit 123, only the MOS transistor 421 of the bidirectional conveying unit 124 can be brought into a conducting state.

Figure 23:
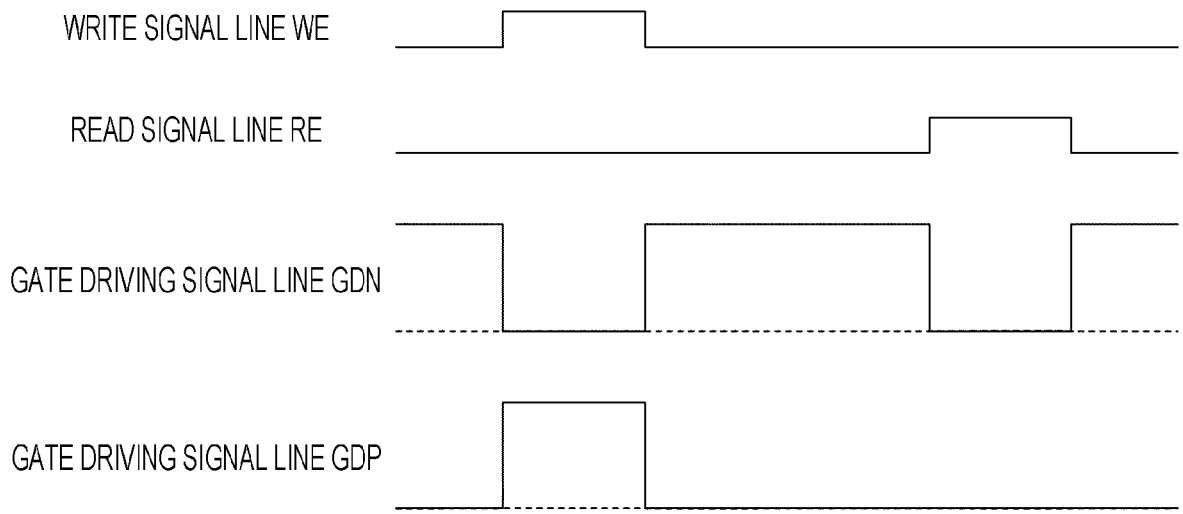
FIG. 23 is a diagram illustrating another example of a gate driving signal in the second modified example according to the second embodiment of the present technology.

FIG. 23 is a diagram illustrating another example of an ON signal in the second modified example according to the second embodiment of the present technology. The same figure differs from the ON signal described in FIG. 22 in that when a signal is input from the read signal line RE, an ON signal is output only to the gate driving signal line GDN. In this case, the control unit 122 obtained by omitting the non-inverting type gate driving unit 436 in the control unit 122 described in FIG. 17 can be used. In this case, the outputs of the inverting type gate driving units 431 and 435 are commonly connected to the signal line GDN, and the output of the non-inverting type gate driving unit 436 is connected to the signal line GDP.

The configuration of the image pickup device 1 other than the above is similar to that in the first modified example of the second embodiment of the present technology, and therefore the description thereof will be omitted.

Thus, in the second modified example of the second embodiment of the present technology, the bidirectional conveying unit 124 is configured by two MOS transistors. As the result, the control unit 122 and the bidirectional conveying unit 124 can be more simply configured.

3. Third Embodiment

In the second modified example of the second embodiment described above, when data is output from the holding unit 123, one MOS transistor is brought into a conducting state in the bidirectional conveying unit 124. Meanwhile, in the second embodiment of the present technology, a MOS transistor is brought into a conducting state after the signal line 101 is precharged. The third embodiment differs from the second modified example of the second embodiment of the present technology described above in that precharging is performed.

[Configuration of Bidirectional Conveying Unit]

Figure 24:
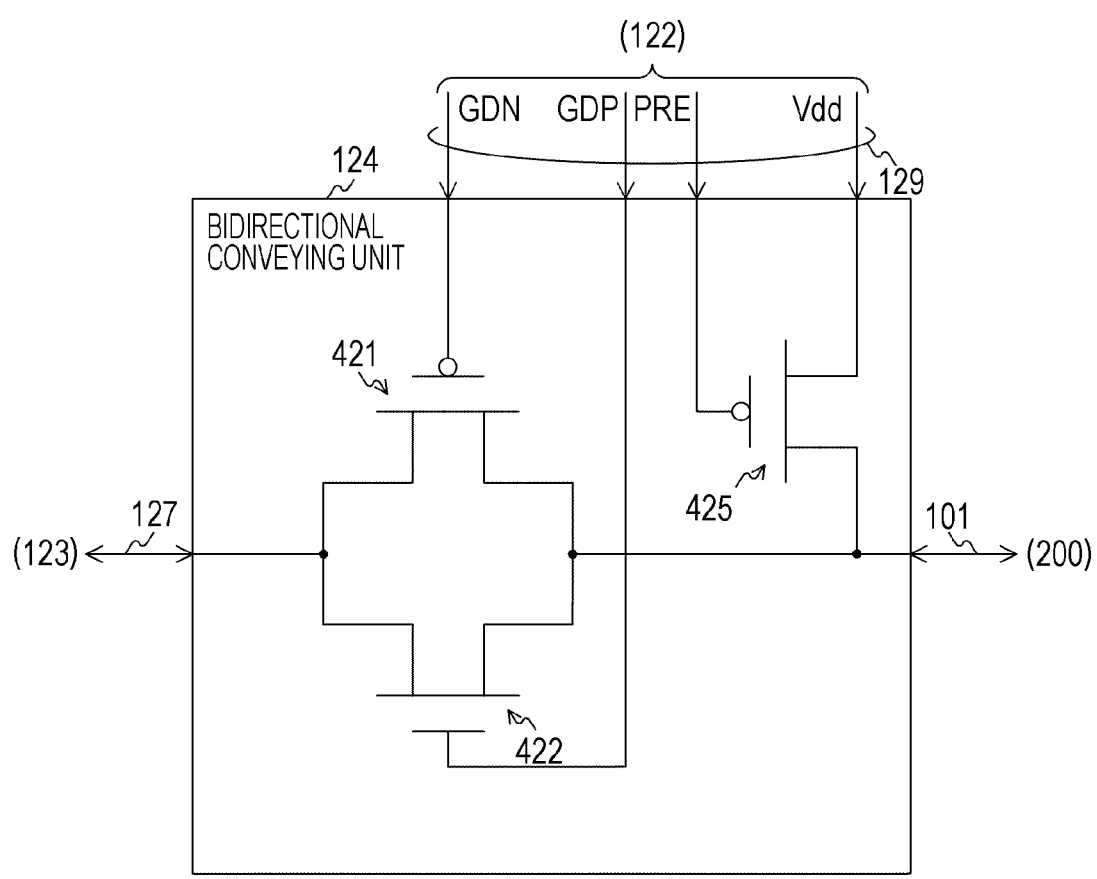
FIG. 24 is a diagram illustrating a configuration example of the bidirectional conveying unit 124 according to a third embodiment of the present technology.

FIG. 24 is a diagram illustrating a configuration example of the bidirectional conveying unit 124 according to the third embodiment of the present technology. The bidirectional conveying unit 124 in the same figure differs from the bidirectional conveying unit 124 described in FIG. 6 in that the bidirectional conveying unit 124 in the same figure is further provided with the MOS transistor 425. A P-channel MOS transistor can be used as this MOS transistor 425. In addition, a precharge signal line PRE (Precharge) and the power line Vdd are further wired to the bidirectional conveying unit 124 in the same figure.

The gate and the source of the MOS transistor 425 are connected to the gate driving signal line PRE and the power line Vdd respectively. The drain of the MOS transistor 425 is connected to the signal line 101. The configuration of the bidirectional conveying unit 124 other than the above is similar to that of the bidirectional conveying unit 124 described in FIG. 6, and therefore the description thereof will be omitted.

[Configuration of Control Unit]

Figure 25:
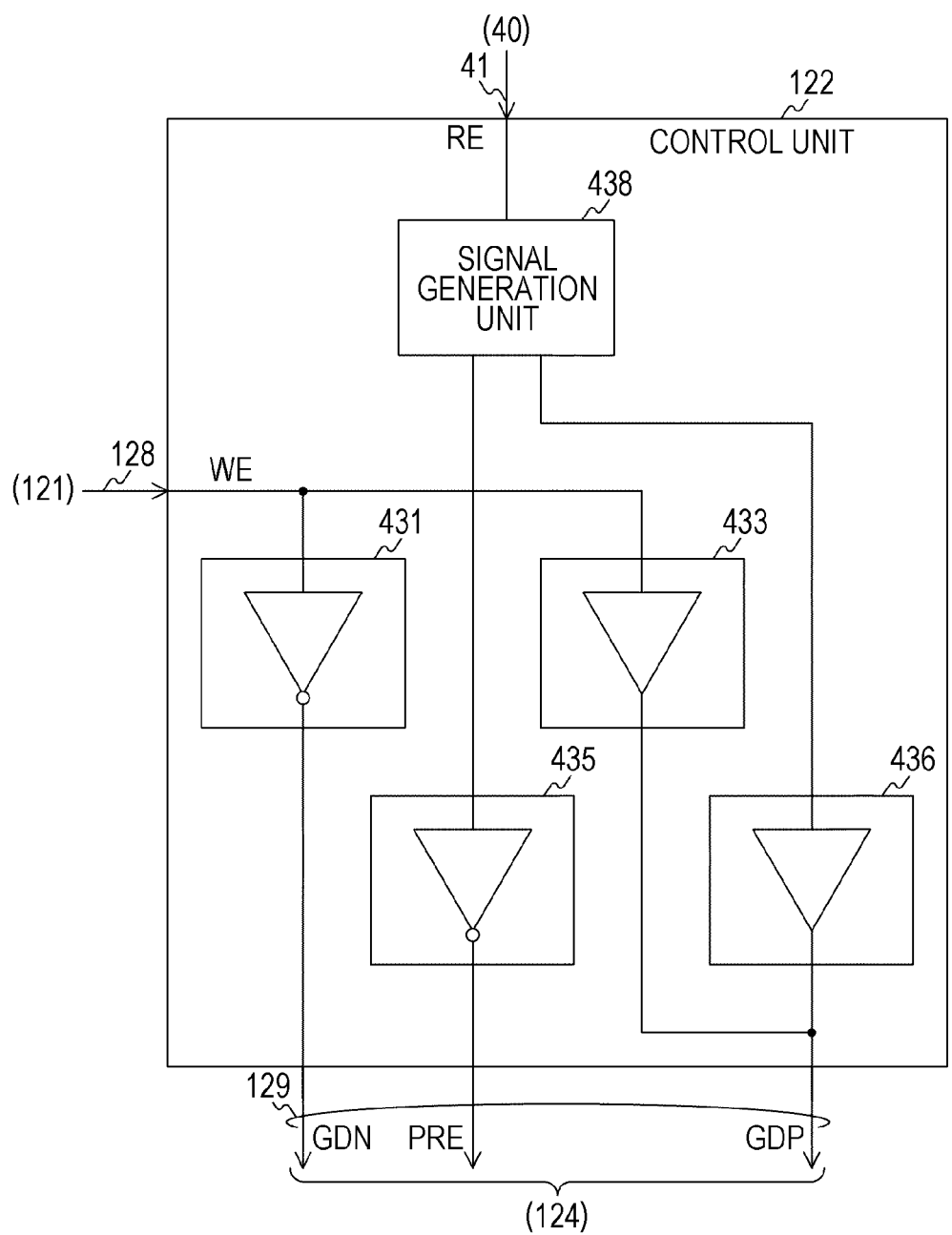
FIG. 25 is a diagram illustrating a configuration example of the control unit 122 according to the third embodiment of the present technology.

FIG. 25 is a diagram illustrating a configuration example of the control unit 122 according to the third embodiment of the present technology. The control unit 122 in the same figure differs from the control unit 122 described in FIG. 17 in that the control unit 122 in the same figure is further provided with a signal generation unit 438. The read signal line RE is connected to this signal generation unit 438, and a signal is input therethrough. The signal generation unit 438 generates, from this input signal, a signal used as a reference of an ON signal that is output to the precharge signal line PRE and the gate driving signal line GDP. The signal generated by the signal generation unit 438 is input into the inverting type gate driving unit 435 and the non-inverting type gate driving unit 436. The configuration of the control unit 122 other than the above is similar to that of the control unit 122 described in FIG. 17, and therefore the description thereof will be omitted.

[ON Signal]

Figure 26:
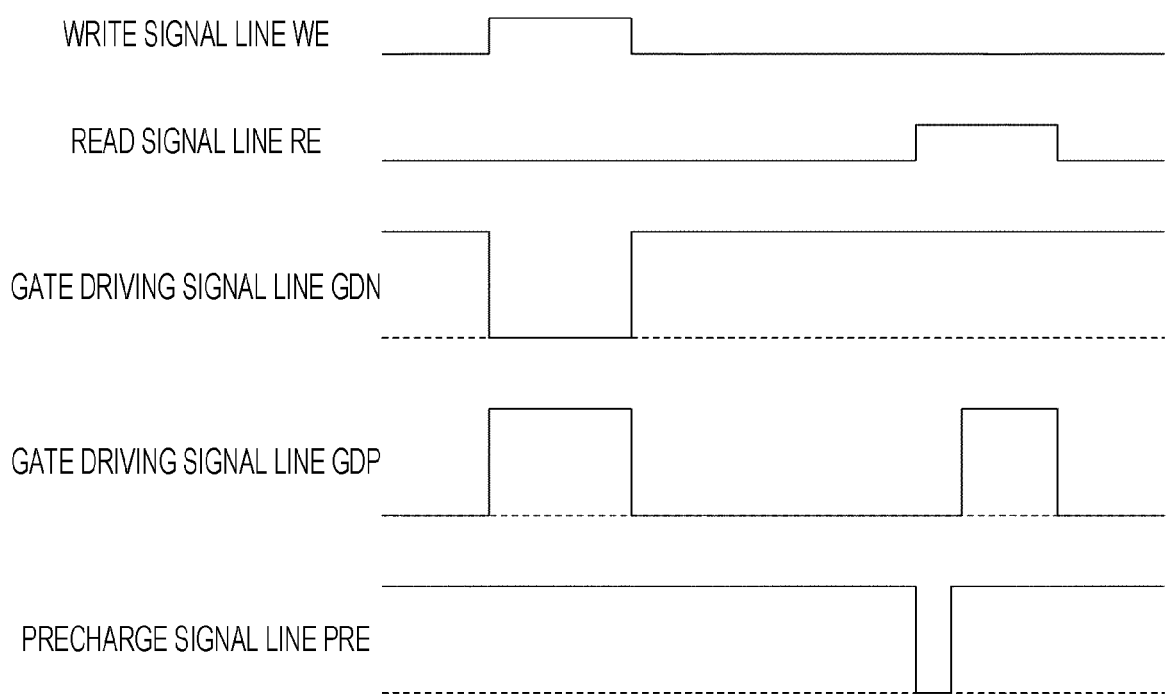
FIG. 26 is a diagram illustrating an example of a gate driving signal according to the third embodiment of the present technology.

FIG. 26 is a diagram illustrating an example of an ON signal according to the third embodiment of the present technology. The same figure represents the relationship among input signals by the write signal line WE and the read signal line RE in the control unit 122, and ON signals output to the gate driving signal line GDN and the precharge signal line PRE. When a signal is input from the read signal line RE, an ON signal is output to the precharge signal line PRE for a short period. After the output of the ON signal to the precharge signal line PRE is stopped, the ON signal is output to the gate driving signal line GDP. The above-described signal generation unit 438 generates a signal used as a reference of these ON signals.

As described in FIG. 22, in the second modified example of the second embodiment of the present technology as well, when data is read from the holding unit 123, the ON signal is output only to the gate driving signal line GDP, and only the MOS transistor 422 is brought into a conducting state in the bidirectional conveying unit 124. In this case, a value of "1" is held in the holding unit 123, and when a voltage of the signal line 101 is the ground voltage, the internal resistance of the bidirectional conveying unit 124 viewed from the signal line 101 is brought into a low state, and consequently a malfunction occurs. Thus, in the second modified example of the second embodiment described above, depending on a value held in the holding unit 123 and a voltage of the signal line 101, there is a possibility that a malfunction will occur.

Meanwhile, in the third embodiment of the present technology, when data is output from the holding unit 123, the MOS transistor 425 is brought into a conducting state immediately before the MOS transistor 422 is brought into a conducting state, thereby charging the stray capacitor 463 to increase the voltage of the signal line 101. The internal resistance of the bidirectional conveying unit 124 viewed from the signal line 101 can be increased by the precharging. Meanwhile, in a case where a value of "1" is held in the holding unit 123, no malfunction will occur regardless of whether or not precharging has been performed. In this manner, capability of preventing malfunction can be enhanced by performing precharging.

In addition, in the pixel array unit 10 having a configuration in which the plurality of pixels 100 are connected to one signal line 101 as well, when data is output from the respective holding units 123 of the plurality of pixels 100, precharging can be performed In this case, it is possible to employ a configuration in which one of the plurality of pixels 100 is provided with the MOS transistor 425. In other words, one MOS transistor 425 can be shared by the plurality of pixels.

Another Configuration of Bidirectional Conveying Unit

Figure 27:
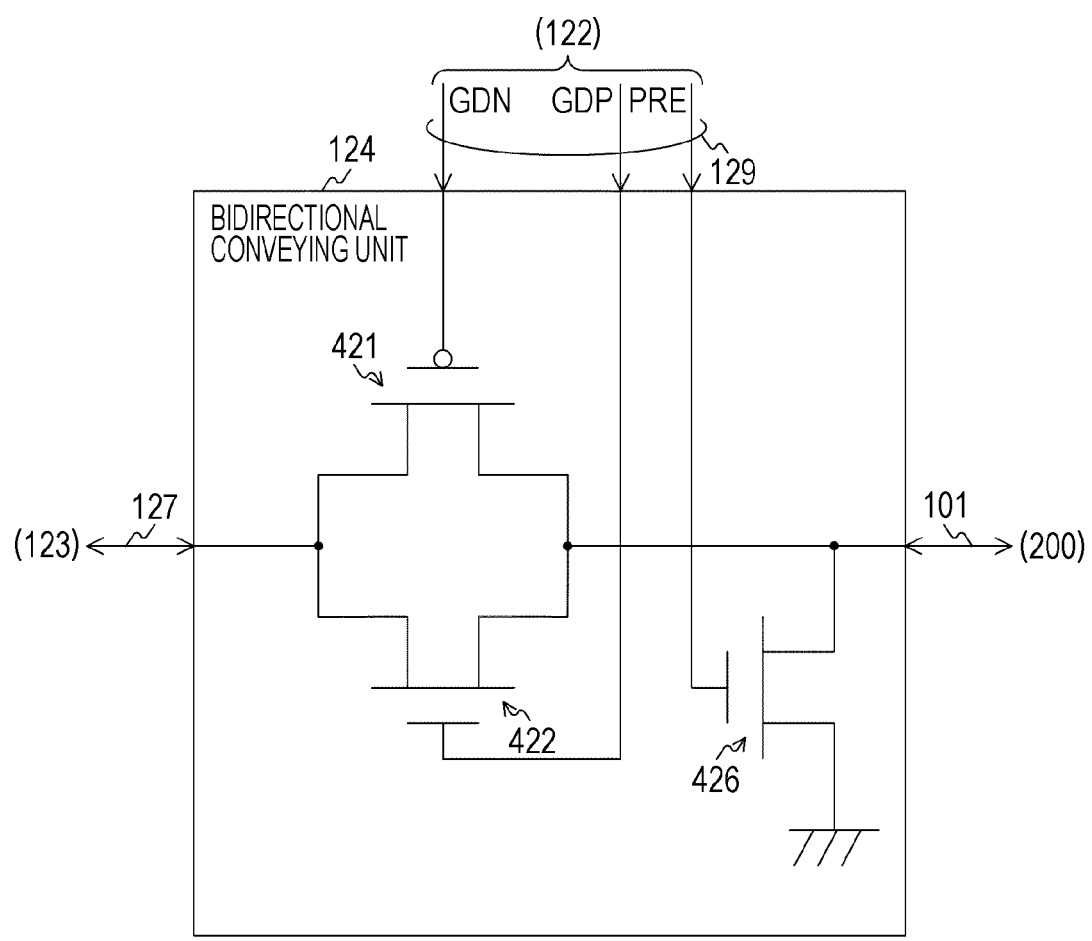
FIG. 27 is a diagram illustrating another configuration example of the bidirectional conveying unit 124 according to the third embodiment of the present technology.

FIG. 27 is a diagram illustrating another configuration example of the bidirectional conveying unit 124 according to the third embodiment of the present technology. The bidirectional conveying unit 124 in the same figure differs from the bidirectional conveying unit 124 described in FIG. 24 in that the bidirectional conveying unit 124 in the same figure is provided with a MOS transistor 426 as an alternative to the MOS transistor 425. A N-channel MOS transistor can be used as this MOS transistor 426. In addition, the bidirectional conveying unit 124 in the same figure is not required to be provided with the power line Vdd.

The gate of the MOS transistor 426 is connected to the gate driving signal line PRE, and the source is grounded. The drain of the MOS transistor 426 is connected to the signal line 101. In this manner, at the time of precharging, the bidirectional conveying unit 124 in the same figure causes the signal line 101 to be at the ground voltage, in other words, the stray capacitor 463 is discharged. The configuration of the bidirectional conveying unit 124 other than the above is similar to that of the bidirectional conveying unit 124 described in FIG. 24, and therefore the description thereof will be omitted.

[Another Configuration of Control Unit]

Figure 28:
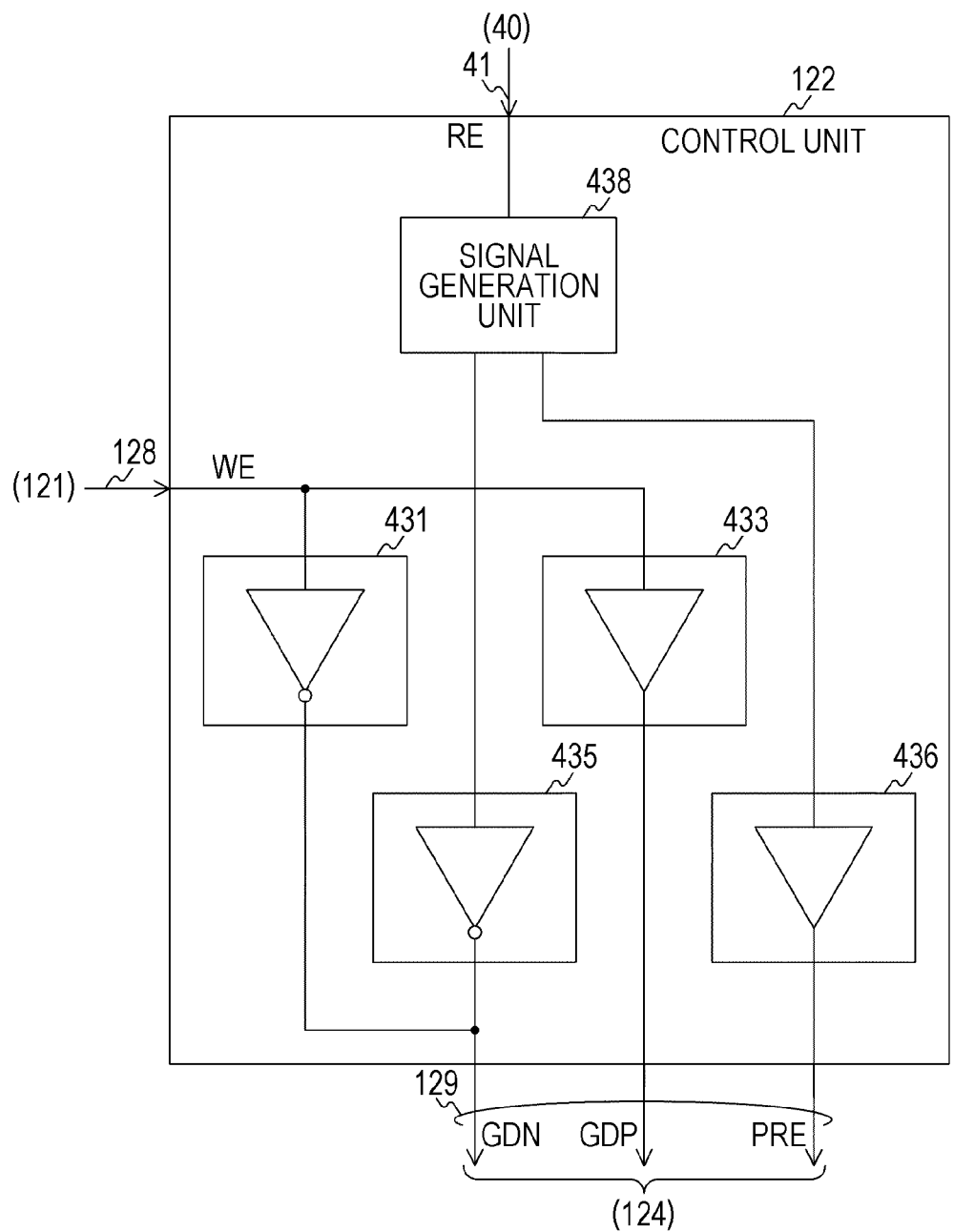
FIG. 28 is a diagram illustrating another configuration example of the control unit 122 according to the third embodiment of the present technology.

FIG. 28 is a diagram illustrating another configuration example of the control unit 122 according to the third embodiment of the present technology. The control unit 122 in the same figure differs from the control unit 122 described in FIG. 25 on the following points. The outputs of the inverting type gate driving units 431 and 435 are commonly connected to the gate driving signal line GDN, and the outputs of the non-inverting type gate driving units 433 and 436 are connected to the gate driving signal line GDP and the precharge signal line PRE respectively. The configuration of the control unit 122 other than the above is similar to that of the control unit 122 described in FIG. 25, and therefore the description thereof will be omitted.

[Another Example of ON Signal]

Figure 29:
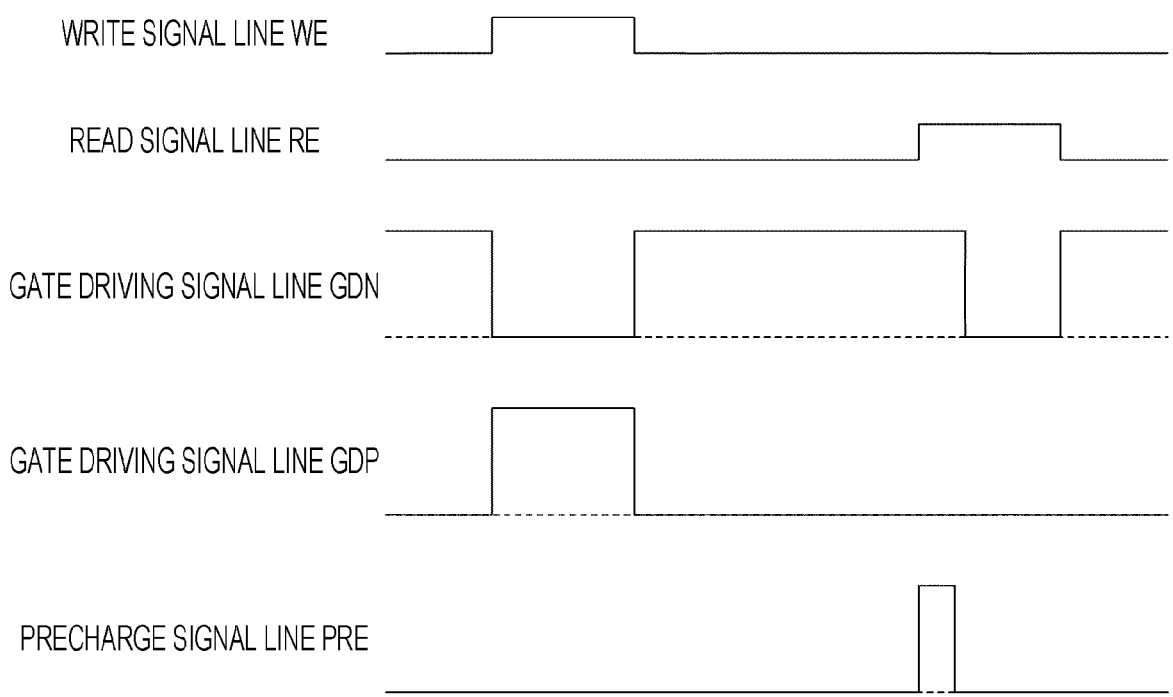
FIG. 29 is a diagram illustrating another example of a gate driving signal according to the third embodiment of the present technology.

FIG. 29 is a diagram illustrating another example of an ON signal according to the third embodiment of the present technology. In the example mentioned in the same figure, at the time of outputting from the holding unit 123, only the MOS transistor 421 of the bidirectional conveying unit 124 is brought into a conducting state. In this case as well, performing precharging by the MOS transistor 426 beforehand enables a malfunction to be prevented from occurring.

The configuration of the image pickup device 1 other than the above is similar to that in the first embodiment of the present technology, and therefore the description thereof will be omitted.

Thus, according to the third embodiment of the present technology, after precharging, bringing any one of the MOS transistors, which compose the bidirectional conveying unit 124, into a conducting state enables a malfunction to be prevented from occurring.

4. Modified Example

In the embodiment described above, two inverting gates are used for the holding unit 123. Meanwhile, in a modified example according to the embodiment of the present technology, a control terminal-equipped inverting gate is used as an alternative to the inverting gate that outputs held data. The modified example differs from the above-described embodiment in that the control terminal-equipped inverting gate is used to control the output of data from the holding unit 123.

[Configuration of Holding Unit]

Figure 30:
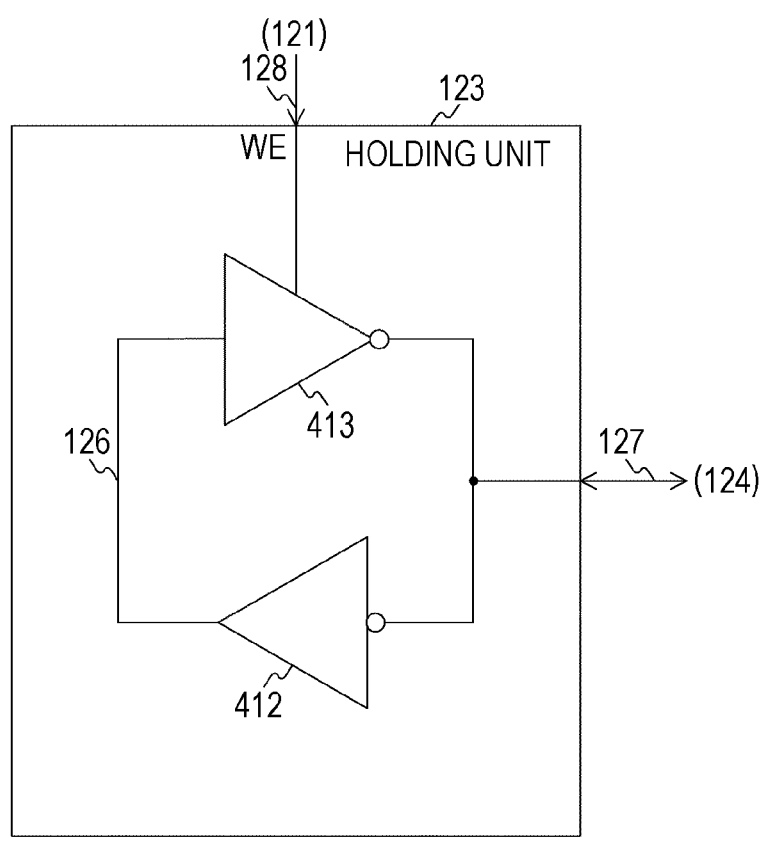
FIG. 30 is a diagram illustrating a configuration example of the holding unit 123 in a modified example according to the embodiment of the present technology.

FIG. 30 is a diagram illustrating a configuration example of the holding unit 123 in the modified example according to the embodiment of the present technology. This holding unit 123 differs from the holding unit 123 described in FIG. 5 in that this holding unit 123 is provided with a control terminal-equipped inverting gate 413 as an alternative to the inverting gate 411. The signal line 128 (the write signal line WE) described in FIG. 4 is connected to the control terminal of the control terminal-equipped inverting gate 413.

In a case where a signal having a value "0" is input into the control terminal, the control terminal-equipped inverting gate 413 outputs a signal in which logic of the input signal is inverted. Therefore, when a signal that has been input into a control terminal of the control terminal-equipped inverting gate 411 has a value of "0", the control terminal-equipped inverting buffer 413 and the inverting buffer 412 compose a latch, and hold data. Meanwhile, when a signal having a value of "1" is input into the control terminal, the output of the control terminal-equipped inverting gate 413 is brought into a high impedance state. When a signal of the write signal line WE is input into this control terminal, data output of the control terminal-equipped inverting gate 413 can be stopped during a time period during which the signal of the write signal line WE has a value of "1". In other words, the operation of the control terminal-equipped inverting gate 413 can be stopped during the time periods from T2 to T3 and from T11 to T12 described in FIG. 13, thereby enabling the power consumption to be reduced. Subsequently, when the value of the signal of the write signal line WE changes from "1" to "0", the time code that has been input is held in the holding unit 123.

The configuration of the image pickup device 1 other than the above is similar to that in the first embodiment of the present technology, and therefore the description thereof will be omitted.

Thus, according to the modified example of the embodiment of the present technology, using the control terminal-equipped inverting gate for the holding unit 123 enables the power consumption of the image pickup device 1 to be reduced.

As described above, in the embodiments of the present technology, inputting/outputting of a digital signal into/from the holding unit 123 are performed through the bidirectional conveying unit 124 and the common signal line, and when the digital signal is output from the holding unit 123, the internal resistance of the bidirectional conveying unit 124 is made high. As the result, in the analog-digital conversion unit 120, the configuration of which is simplified, it is possible to prevent a malfunction caused when a digital signal is read from the holding unit 123.

It should be noted that the above embodiment is described as an example for realizing the present technology, and the matters in the embodiment and the invention defining matters in claims respectively have correspondence relationships therebetween. Similarly, the invention defining matters in claims, and the matters in the embodiment of the present technology, which have the same names as those of the invention defining matters in claims respectively, have respective correspondence relationships therebetween. However, the present technology is not limited to the embodiment, and the present technology can be realized by making various kinds of modifications to the embodiment within the scope that does not deviate from the gist thereof.

In addition, the processing procedures described in the above-described embodiments may be considered as a method including the series of steps, or as a program that causes a computer to execute the series of steps, or as a recording medium for storing the program. As this recording medium, for example, a Compact Disc (CD), a MiniDisc (MD), a Digital Versatile Disc (DVD), a memory card, a Blu-ray Disc (Blu-ray (registered trademark) Disc) or the like can be used.

It should be noted that the effects described in the present description are to be construed as merely illustrative, and are not limitative, and that, in addition, other effects may be produced.

It should be noted that the present technology can also employ the following configurations.

(1) An analog-digital conversion device including:

a comparison unit that compares an input signal with a reference signal;

a holding unit that holds a digital signal corresponding to the reference signal in timing in which a result of the comparison has changed;

a bidirectional conveying unit that inputs the digital signal into the holding unit to cause the holding unit to hold the digital signal, and reads the held digital signal as a result of analog-digital conversion for the input signal; and a control unit that controls internal resistance of the bidirectional conveying unit to be set at a value that differs between when the holding unit is caused to hold the digital signal, and when the held digital signal is read from the holding unit.

(2) The analog-digital conversion device set forth in the preceding (1), in which the bidirectional conveying unit is configured by a switching element that is brought into a conducting state when an ON signal is input into a control terminal, and the control unit generates the ON signal, and inputs the ON signal into the control terminal.

(3) The analog-digital conversion device set forth in the preceding (2), in which the control unit generates the ON signal that differs between when the holding unit is caused to hold the digital signal, and when the held digital signal is read from the holding unit.

(4) The analog-digital conversion device set forth in the preceding (3), in which the control unit generates an ON signal having a voltage that differs between when the holding unit is caused to hold the digital signal, and when the held digital signal is read from the holding unit.

(5) The analog-digital conversion device set forth in the preceding (3), in which the control unit generates an ON signal, transition time of the ON signal differing between when the holding unit is caused to hold the digital signal, and when the held digital signal is read from the holding unit.

(6) The analog-digital conversion device set forth in any of the preceding (2) to (5), in which the bidirectional conveying unit is configured by the plurality of switching elements that are connected in parallel.

(7) The analog-digital conversion device set forth in the preceding (6), in which the bidirectional conveying unit is configured by the plurality of switching elements that differ in internal resistance in a conducting state.

(8) The analog-digital conversion device set forth in the preceding (6), in which the control unit controls the number of the switching elements into which a control signal is input to differ between when the holding unit is caused to hold the digital signal, and when the held digital signal is read from the holding unit.

(9) The analog-digital conversion device set forth in the preceding (6), in which the bidirectional conveying unit is configured by an N-channel MOS transistor and a P-channel MOS transistor.

(10) The analog-digital conversion device set forth in any of the preceding (1), (2), (8), and (9), further including a precharge unit that applies a predetermined voltage to a terminal for reading the digital signal of the bidirectional conveying unit, in which after the predetermined voltage is applied, the control unit controls the internal resistance of the bidirectional conveying unit to be set at a different value.

(11) The analog-digital conversion device set forth in any of the preceding (1) to (10), in which the holding unit is configured by a latch, and an input terminal and an output terminal of the latch are commonly connected to the bidirectional conveying unit, and the control unit controls the internal resistance of the bidirectional conveying unit to be set at a value that, when the held digital signal is read from the holding unit, causes an applied voltage to be higher than a difference between a voltage applied to the output terminal of the digital signal of the bidirectional conveying unit and an input threshold value of the latch.

(12) A solid state image pickup element including:

a comparison unit that compares, with a reference signal, an input signal that is a signal corresponding to emitted light;

a holding unit that holds a digital signal corresponding to the reference signal in timing in which a result of the comparison has changed;

a bidirectional conveying unit that inputs the digital signal into the holding unit to cause the holding unit to hold the digital signal, and reads the held digital signal as a result of analog-digital conversion for the input signal; and a control unit that controls internal resistance of the bidirectional conveying unit to be set at a value that differs between when the holding unit is caused to hold the digital signal, and when the held digital signal is read from the holding unit.

(13) An image pickup device including:

a comparison unit that compares, with a reference signal, an input signal that is a signal corresponding to emitted light;

a holding unit that holds a digital signal corresponding to the reference signal in timing in which a result of the comparison has changed;

a bidirectional conveying unit that inputs the digital signal into the holding unit to cause the holding unit to hold the digital signal, and reads the held digital signal as a result of analog-digital conversion for the input signal; and a control unit that controls internal resistance of the bidirectional conveying unit to be set at a value that differs between when the holding unit is caused to hold the digital signal, and when the held digital signal is read from the holding unit; and a processing circuit that processes the output digital signal.

REFERENCE SIGNS LIST

1 Image pickup device
10 Pixel array unit
20 Time code generation unit
30 Reference signal generation unit
40 Vertical drive unit
50 Horizontal control unit
52 Time code decoding unit
53 Column signal processing unit
54 Clock signal generation unit
100 Pixel
110 Photoelectric conversion unit
120 AD converter
121 Comparison unit
122 Control unit
123 Holding unit
124 Bidirectional conveying unit
200 Time code transfer unit
411, 412 Inverting gate
413 Control terminal-equipped inverting gate
421 to 426 MOS transistor
431, 432, 435 Inverting type gate driving unit
433, 434, 436 Non-inverting type gate driving unit
437 OR gate
438 Signal generation unit

The invention claimed is:

1. An analog-digital conversion device, comprising:
a comparison unit configured to compare an input signal with a reference signal;
a holding unit configured to hold a digital signal corresponding to the reference signal, wherein the digital signal is held in timing in which a result of the comparison has changed;
a bidirectional conveying unit configured to:
input the digital signal into the holding unit to cause the holding unit to hold the digital signal; and
read the held digital signal as a result of analog-digital conversion for the input signal, wherein
the bidirectional conveying unit is configured by a switching element, and
the switching element is configured to be brought into a conducting state based on input of an ON signal into a control terminal; and
a control unit configured to:
control an internal resistance of the bidirectional conveying unit, wherein a first value of the internal resistance when the holding unit is caused to hold the digital signal differs from a second value of the internal resistance when the held digital signal is read from the holding unit;
generate the ON signal; and
input the ON signal into the control terminal.

2. The analog-digital conversion device according to claim 1, wherein the control unit is further configured to generate the ON signal that differs when the holding unit is caused to hold the digital signal and when the held digital signal is read from the holding unit.

3. The analog-digital conversion device according to claim 2, wherein the control unit is further configured to generate the ON signal having a voltage that differs when the holding unit is caused to hold the digital signal and when the held digital signal is read from the holding unit.

4. The analog-digital conversion device according to claim 2, wherein
the control unit is further configured to generate the ON signal,
a first transition time of the ON signal when the holding unit is caused to hold the digital signal differs from a second transition time of the ON signal when the held digital signal is read from the holding unit.

5. The analog-digital conversion device according to claim 1, wherein the bidirectional conveying unit is configured by a plurality of switching elements that are connected in parallel.

6. The analog-digital conversion device according to claim 5, wherein the bidirectional conveying unit is configured by the plurality of switching elements that differ in the internal resistance in the conducting state.

7. The analog-digital conversion device according to claim 5, wherein
the control unit is further configured to control a number of the plurality of switching elements into which a control signal is input, and
a first number of the plurality of switching elements when the holding unit is caused to hold the digital signal differs from a second number of the plurality of switching elements when the held digital signal is read from the holding unit.

8. The analog-digital conversion device according to claim 5, wherein the bidirectional conveying unit is configured by an N-channel MOS transistor and a P-channel MOS transistor.

9. The analog-digital conversion device according to claim 1,
further comprising a precharge unit configured to apply a voltage to a terminal to read the digital signal of the bidirectional conveying unit,
wherein based on the application of the voltage, the control unit is further configured to control the internal resistance of the bidirectional conveying unit to be set at a different value.

10. The analog-digital conversion device according to claim 1, wherein
the holding unit is configured by a latch,
an input terminal and an output terminal of the latch are commonly connected to the bidirectional conveying unit, and
the control unit is further configured to control the internal resistance of the bidirectional conveying unit to be set at the second value, when the held digital signal is read from the holding unit, wherein the second value of the internal resistance causes an applied voltage to be higher than a difference between a voltage applied to the output terminal of the digital signal of the bidirectional conveying unit and an input threshold value of the latch.

11. A solid state image pickup element comprising:
a comparison unit configured to compare an input signal with a reference signal, wherein the input signal corresponds to emitted light;
a holding unit configured to hold a digital signal corresponding to the reference signal, wherein the digital signal is held in timing in which a result of the comparison has changed;
a bidirectional conveying unit configured to:
input the digital signal into the holding unit to cause the holding unit to hold the digital signal; and
read the held digital signal as a result of analog-digital conversion for the input signal, wherein
the bidirectional conveying unit is configured by a switching element, and
the switching element is configured to be brought into a conducting state based on input of an ON signal into a control terminal; and
a control unit configured to:
control an internal resistance of the bidirectional conveying unit, wherein a first value of the internal resistance when the holding unit is caused to hold the digital signal differs from a second value of the internal resistance when the held digital signal is read from the holding unit;
generate the ON signal; and
input the ON signal into the control terminal.

12. An image pickup device, comprising:
a comparison unit configured to compare an input signal with a reference signal, wherein the input signal corresponds to emitted light;
a holding unit configured to hold a digital signal corresponding to the reference signal, wherein the digital signal is held in timing in which a result of the comparison has changed;
a bidirectional conveying unit configured to:
input the digital signal into the holding unit to cause the holding unit to hold the digital signal; and
read the held digital signal as a result of analog-digital conversion for the input signal, wherein
the bidirectional conveying unit is configured by a switching element, and
the switching element is configured to be brought into a conducting state based on input of an ON signal into a control terminal;
a control unit configured to:
control an internal resistance of the bidirectional conveying unit, wherein a first value of the internal resistance when the holding unit is caused to hold the digital signal differs from a second value of the internal resistance when the held digital signal is read from the holding unit;
generate the ON signal; and
input the ON signal into the control terminal; and
a processing circuit configured to process the read digital signal.

13. An analog-digital conversion device, comprising:
a comparison unit configured to compare an input signal with a reference signal;
a holding unit configured to hold a digital signal corresponding to the reference signal, wherein the digital signal is held in timing in which a result of the comparison has changed;
a bidirectional conveying unit configured to:
input the digital signal into the holding unit to cause the holding unit to hold the digital signal; and
read the held digital signal as a result of analog-digital conversion for the input signal, wherein
the bidirectional conveying unit is configured by a switching element, and
the switching element is configured to be brought into a conducting state based on input of an ON signal into a control terminal; and
a control unit configured to:
control an internal resistance of the bidirectional conveying unit, wherein a first value of the internal resistance when the holding unit is caused to hold the digital signal differs from a second value of the internal resistance when the held digital signal is read from the holding unit;
generate the ON signal that differs when the holding unit is caused to hold the digital signal and when the held digital signal is read from the holding unit; and
input the ON signal into the control terminal.

* * * * *